United States Patent
Chen

(10) Patent No.: US 10,524,392 B1
(45) Date of Patent: Dec. 31, 2019

(54) DISSIPATING HEAT USING PHASE CHANGE MATERIAL

(71) Applicant: Intel Corporation, Santa Clara, CA (US)

(72) Inventor: Tsung-Yu Chen, Tapei (TW)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/146,671

(22) Filed: Sep. 28, 2018

(51) Int. Cl.
H05K 7/20 (2006.01)
C09K 5/06 (2006.01)

(52) U.S. Cl.
CPC ......... H05K 7/20463 (2013.01); C09K 5/063 (2013.01); H05K 7/205 (2013.01); H05K 7/2029 (2013.01)

(58) Field of Classification Search
CPC .... H05K 1/00–0212; H05K 3/22; H05K 3/40; H05K 3/4038; H05K 7/20463; H05K 7/2029; H05K 7/205; H05K 7/20936; H05K 7/20663; H05K 7/208; H05K 7/20881; H05K 2201/064; H01L 21/56; H01L 21/565; H01L 21/48; H01L 21/4846; H01L 23/427; H01L 23/367; H01L 23/4275; H01L 23/567; C09K 5/063; F28D 20/02; F28D 20/023

USPC ......... 361/700, 704; 165/80.4–80.5, 104.33; 257/715, E23.088
See application file for complete search history.

(56) References Cited

U.S. PATENT DOCUMENTS

2015/0249044 A1* 9/2015 Arora ................. H01L 23/4275 257/707
2016/0316565 A1* 10/2016 Chen ...................... H05K 1/185
2019/0110356 A1* 4/2019 Silvano De Sousa ...................... H05K 1/0203

* cited by examiner

Primary Examiner — Dion Ferguson
Assistant Examiner — Amir A Jalali
(74) Attorney, Agent, or Firm — Schwegman Lundberg & Woessner, P.A.

(57) ABSTRACT

A device can dissipate heat from an electrical component by using a phase change material. A horizontal circuitry layer can have opposing first and second sides. A vertical hole can extend through the horizontal circuitry layer. A vertical channel can include a phase change material positioned in the vertical hole and in thermal contact with the first and second sides of the horizontal circuitry layer. The phase change material can dissipate a first amount of heat from the first side by absorbing the first amount of heat and changing phase from a solid form to a liquid form. The phase change material, when in the liquid form, can dissipate a second amount of heat from the first side by transporting the second amount of heat via convection from the first side of the horizontal circuitry layer to the second side of the horizontal circuitry layer.

15 Claims, 20 Drawing Sheets

DISSIPATING HEAT USING PHASE CHANGE MATERIAL

FIELD OF THE DISCLOSURE

The present disclosure relates generally to circuitry that can dissipate heat from a heat-producing electrical component.

BACKGROUND OF THE DISCLOSURE

Failure to adequately dissipate heat from a heat-producing electrical component can lead to failure of the component, or heat-related damage elements near the heat-producing electrical component.

Figure 1:
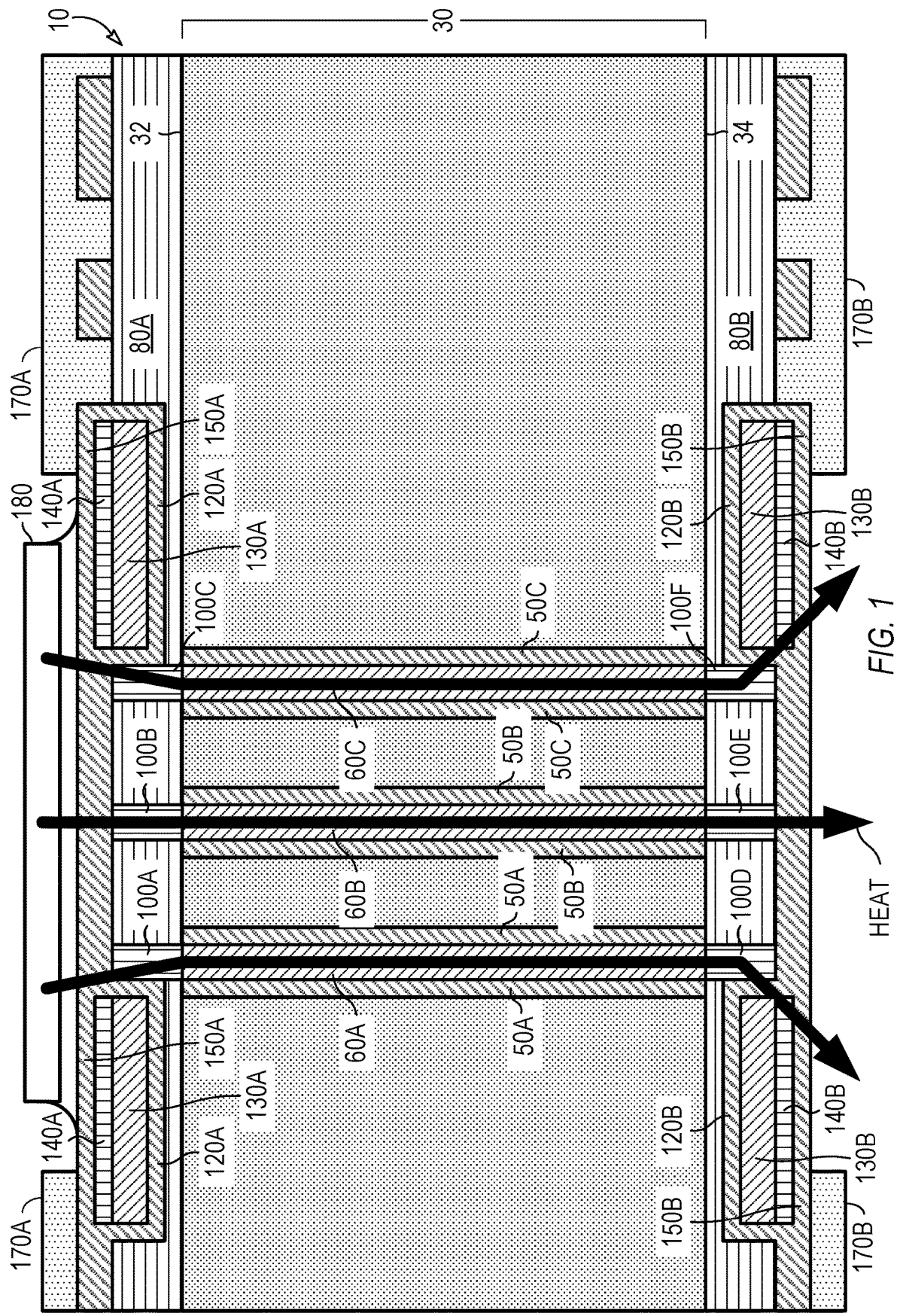
FIG. 1 shows a cross-sectional side view of an example of a device that can dissipate heat from an electrical component by using a phase change material, in accordance with some examples.

Corresponding reference characters indicate corresponding parts throughout the several views. Elements in the drawings are not necessarily drawn to scale. The configurations shown in the drawings are merely examples, and should not be construed as limiting the scope of the inventive subject matter in any manner.

DETAILED DESCRIPTION

A device can dissipate heat from an electrical component by using a phase change material. A horizontal circuitry layer can have opposing first and second sides. A vertical hole can extend through the horizontal circuitry layer. A vertical channel can include a phase change material positioned in the vertical hole and in thermal contact with the first and second sides of the horizontal circuitry layer. The phase change material can dissipate a first amount of heat from the first side by absorbing the first amount of heat and changing phase from a solid form to a liquid form. The phase change material, when in the liquid form, can dissipate a second amount of heat from the first side by transporting the second amount of heat via convection from the first side of the horizontal circuitry layer to the second side of the horizontal circuitry layer.

In the figures and the text that follows, the terms "top", "bottom", "horizontal", and "vertical" are used to show orientations of particular features on particular elements, or relative orientations of one element to another element. The designations of horizontal and vertical are used merely for convenience and clarity, and are not intended to represent absolute orientation or direction. For example, a "top" surface of an element remains a top surface regardless of an absolute orientation of the element, even if the element is inverted during storage or use. This document uses the common convention of a chip package being positioned horizontally on top of a horizontal motherboard, which establishes directions of up and down, and top and bottom, relative to this convention.

FIG. 1 shows a cross-sectional side view of an example of a device 10 that can dissipate heat from an electrical component 180 by using a phase change material, in accordance with some examples. The configuration of FIG. 1 is but one example of a device that dissipate heat from an electrical component by using a phase change material; other suitable configurations can also be used.

Figure 3:
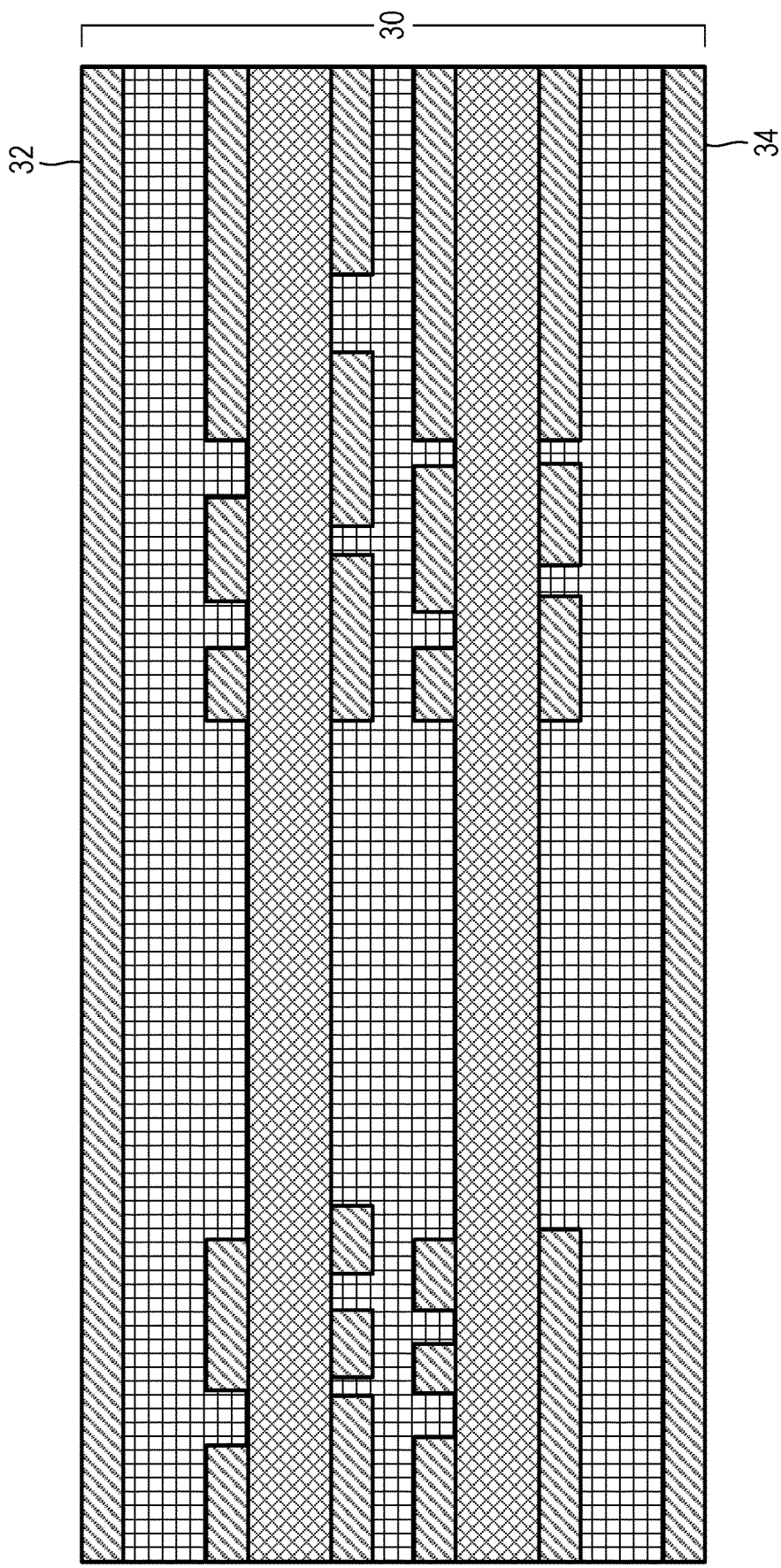

A horizontal circuitry layer 30 can have a first side 32 and a second side 34 opposite the first side 32. There can be additional structure to the horizontal circuitry layer 30, which is shown in FIG. 3 and discussed below.

In the examples discussed herein, the device 10 is configured to contact the heat-producing electrical component 180 from the first side 32 of the horizontal circuitry layer 30. In some examples, the device 10 can optionally additionally include elements on the second side 34 of the horizontal circuitry layer 30 that mimic the structure and function of the corresponding elements on the first side 32 of the horizontal circuitry layer 30, although these elements on the second side 34 need not be essential for operation.

A vertical hole can be formed as a bore extending through the horizontal circuitry layer 30. The vertical hole is shown in further detail in FIG. 4, and discussed below. In some examples, the vertical hole can be one of several vertical holes extending through the horizontal circuitry layer 30. Although three vertical holes are shown in FIG. 1, any suitable number of vertical holes (such as one, two, three, or more than three) can also be used.

A vertical channel 60A-C can include a first phase change material positioned in the vertical hole (or positioned in each of several vertical holes). The first phase change material can thermally contact the first side 32 and the second side 34 of the horizontal circuitry layer 30. In some examples, the first phase change material can be the same for all the vertical channels 60A-C. In some examples, the first phase change material can be different for at least two of the vertical channels 60A-C. In some examples, the different phase change materials can have different melting point temperatures.

In some examples, the first phase change material can be a thermoresponsive gel that is a solid at room temperature (such as 20° C.) and a liquid at elevated temperatures above room temperature. In some examples, the first phase change material can be a thermoresponsive polymer. In some examples, the thermoresponsive polymer can be poly(vinyl alcohol) doping or crosslink with inorganic salt. Other suitable materials can also be used.

The first phase change material can dissipate a first amount of heat from the first side 32 by absorbing the first amount of heat and changing phase from a solid form to a liquid form. In some examples, the first phase change material, when in the liquid form, can dissipate a second amount of heat from the first side 32 by transporting the second amount of heat via convection from the first side 32 of the horizontal circuitry layer 30 to the second side 34 of the horizontal circuitry layer 30.

A containment layer 50A-C can be disposed inside each bore. Each containment layer 50A-C can define an interior of a respective vertical channel 60A-C. Each containment layer 50A-C can contact the first phase change material in the respective vertical channel 60A-C. The first phase change material, positioned in the vertical channels 60A-C, is configured to direct heat vertically, away from the heat-producing electrical component 180.

A dielectric film 80A can be disposed on the first side 32 of the horizontal circuitry layer 30. The dielectric film 80A can include one or more through holes that each expose a respective vertical hole in the horizontal circuitry layer 30. In some examples, an optional additional dielectric film 80B can be disposed on the second side 34 of the horizontal circuitry layer 30.

A plug 100A-C can be disposed in each through hole of the dielectric film 80A. The plugs 100A-C can seal first ends of the vertical holes proximate the first side 32 of the horizontal circuitry layer 30. In some examples, a plug 100D-F can be disposed in each through hole of the dielectric film 80B. The plugs 100D-F can seal second ends of the vertical holes proximate the second side 34 of the horizontal circuitry layer 30. In some examples, the plugs 100A-F can be formed as a sintered paste. Other materials can also be used.

The plugs 100A-C can thermally connect the first phase change material in the vertical channels 60A-C to the first side 32 of the horizontal circuitry layer 30. Similarly, the plugs 100D-F can thermally connect the first phase change material in the vertical channels 60A-C to the second side 34 of the horizontal circuitry layer 30.

The dielectric film 80A can be partially removed in a horizontal trench that at least partially surrounds the plugs 100A-C. Similarly, the dielectric film 80B can be partially removed in an optional additional horizontal trench that at least partially surrounds the plug plugs 100D-F. The horizontal trenches are shown in further detail in FIG. 11, and discussed below.

A first copper layer 120A can be positioned on the dielectric film 80A. The first copper layer 120A can cover the plugs 100A-C and covering the horizontal trench. Similarly, an optional additional first copper layer 120B can be positioned on the dielectric film 80B, and can cover the plugs 100D-F and cover the optional additional horizontal trench.

A horizontal channel 130A can include a second phase change material positioned on the first copper layer 120A in the horizontal trench. The second phase change material, positioned in the horizontal trench, is configured to direct heat horizontally, away from the heat-producing electrical component 180. In some examples, the second phase change material can be the same as the first phase change material. In other examples, the first and second phase change materials can differ. Similarly, an optional additional horizontal channel 130B can include a phase change material positioned on the optional additional first copper layer 120B in the horizontal trench.

A cap 140A can be positioned on the horizontal channel 130A and can seal the second phase change material within the horizontal channel 130A. Similarly, an optional additional cap 140B can be positioned on the horizontal channel 130B and can seal the phase change material within the horizontal channel 130B.

A second copper layer 150A can be disposed on the first copper layer 120A. The second copper layer 150A can cover the cap 140A and thereby surround the horizontal channel 130A and the cap 140A with copper material. The copper material is a good conductor for heat, and can thermally connect the first phase change material, via the plugs 100A-C, to the heat-producing electrical component 180. Similarly, an optional additional second copper layer 150B can be disposed on the first copper layer 120B. The optional additional second copper layer 150B can cover the cap 140B and thereby surround the horizontal channel 130B and the cap 140B with copper material.

A solder mask 170A can be disposed on the second copper layer 150A. The solder mask 170A can expose the second copper layer 150A over the plugs 100A-C and over at least a portion of the cap 140A. The exposed portion of the second copper layer 150A can define a contact region configured to contact the heat-producing electrical component 180.

FIGS. 2-18 show an assembly process for the device 10 of FIG. 1, as various elements of the device 10 are formed, in accordance with some examples. From the initial stage in FIG. 2 of printed circuit boards and layers that are to be assembled together, to the final stage in FIG. 18 of a completed device, the drawings emphasize elements that pertain to a particular manufacturing step. The drawings de-emphasize elements that do not pertain to the particular manufacturing step, by showing those elements with a dashed outline and omitted element numbers. It will be understood that the elements in one drawing still appear in later drawings, but the element numbers have been removed for clarity.

Figure 2:
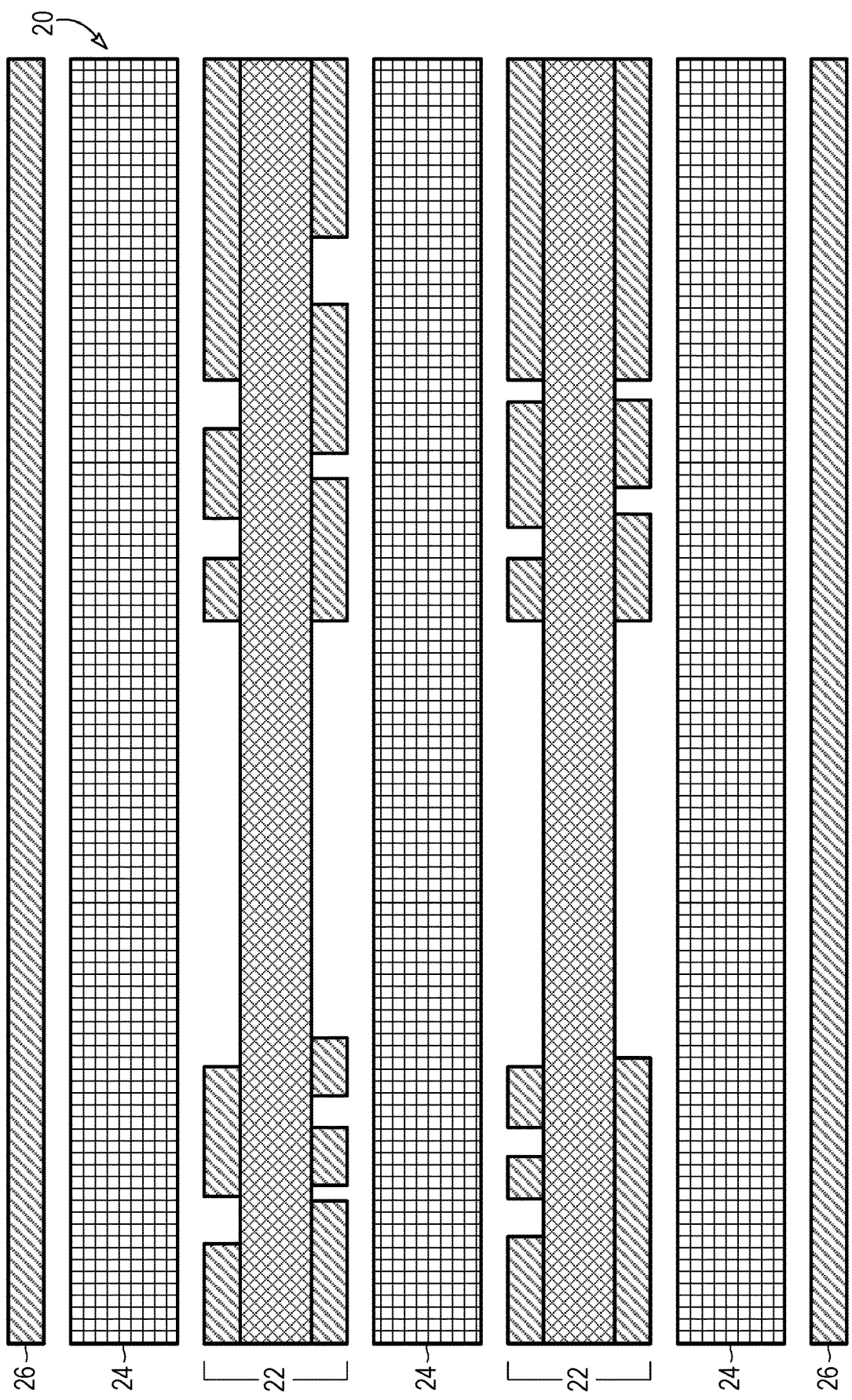
FIGS. 2-18 show an assembly process for the device of FIG. 1, as various elements of the device are formed, in accordance with some examples.

FIG. 2 shows a cross-sectional side view of a plurality of layers 20, to be assembled to form the horizontal circuitry layer 30, which is used to subsequently form the device 10, in accordance with some examples. The layers can be formed independently from one another, and assembled downstream. The layers 20 shown in FIG. 2 are but one example of the types of layers 20 and the number of layers 20 that can form the horizontal circuitry layer 30; other suitable configurations can also be used.

The layers can include one or more inner circuit layers 22. Each inner circuit layer 22 can include a respective substrate and suitable circuitry on a top and/or a bottom of the substrate. In some examples, the suitable circuitry can include copper traces that extend between suitable electrical components.

Each inner circuit layer 22 can be separated from an adjacent inner circuit layer 22 by a spacer layer 24. The spacer layers can be formed from prepreg, which can be a reinforcing fabric that has been pre-impregnated with a resin system. The resin system, typically epoxy, includes a suitable curing agent. As a result, the prepreg spacer layer 24 can be used without adding any addition resin. Other suitable materials can also be used.

At a top and a bottom of the stack of layer 20 are copper foil layers 26. Each copper foil layer 26 can be spaced from other layers by a spacer layer 24.

FIG. 3 shows a cross-sectional side view of an example of a horizontal circuitry layer 30, formed from the layers 20 of FIG. 2, in accordance with some examples. The horizontal circuitry layer 30 of FIG. 3 is but one example of a horizontal circuitry layer 30; other suitable configurations can also be used.

The layers 22, 24, and 26 of FIG. 2 can be laminated together, or attached by any suitable mechanism, to form the horizontal circuitry layer 30. The horizontal circuitry layer 30 can have top and bottom surfaces that include exposed copper material from the copper foil layers 26. The top surface is denoted as the first side 32 of the horizontal circuitry layer 30. The bottom surface is denoted as the second side 34 of the horizontal circuitry layer 30.

Figure 4:
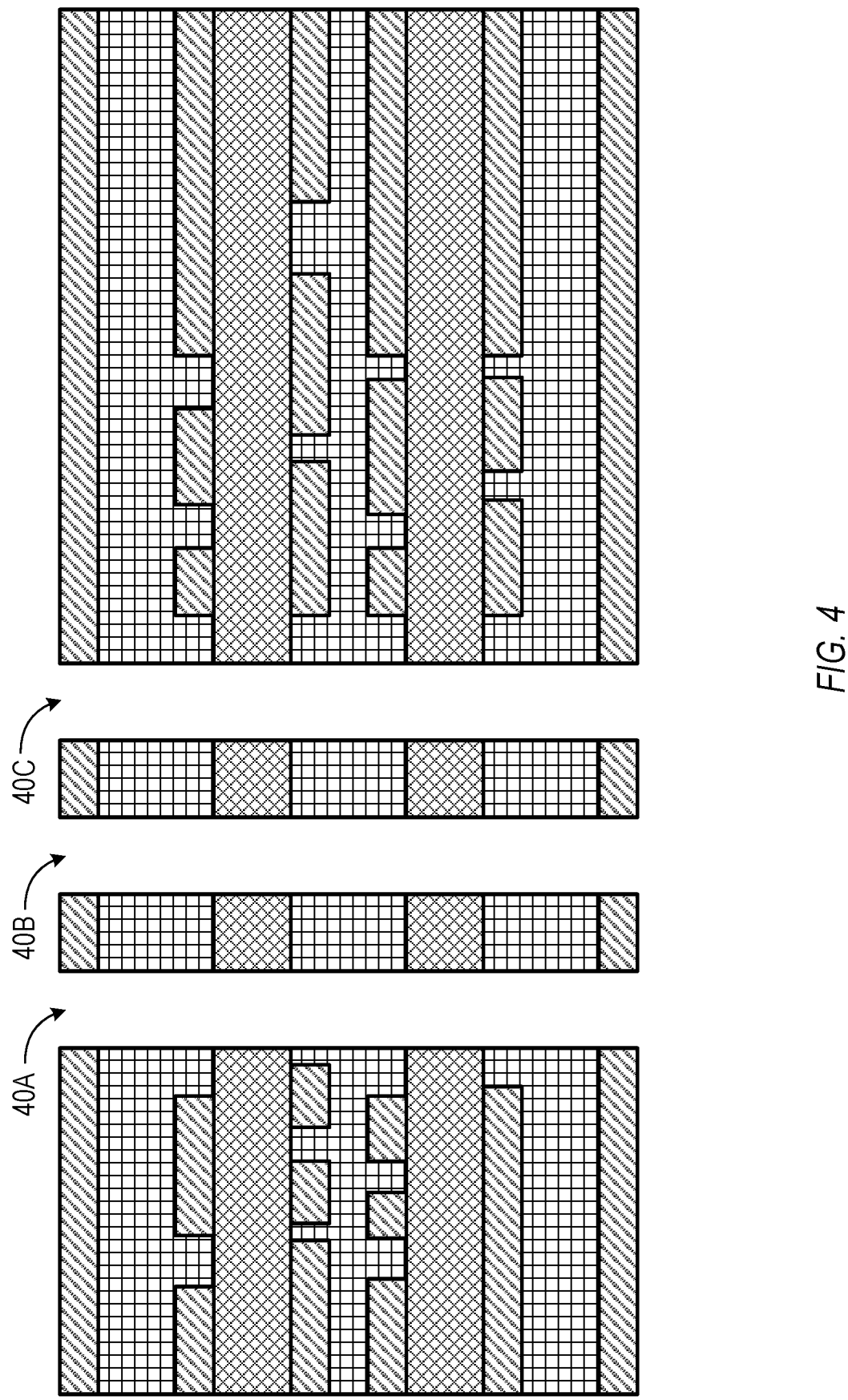

FIG. 4 shows a cross-sectional side view of an example of a device under assembly, after vertical holes 40A-C have been bored through the horizontal circuitry layer 30 of FIG. 3, in accordance with some examples.

The vertical holes 40A-C can be bored, drilled, ablated, or formed in any suitable manner that removes the material from the volume of the vertical holes 40A-C.

Figure 5:
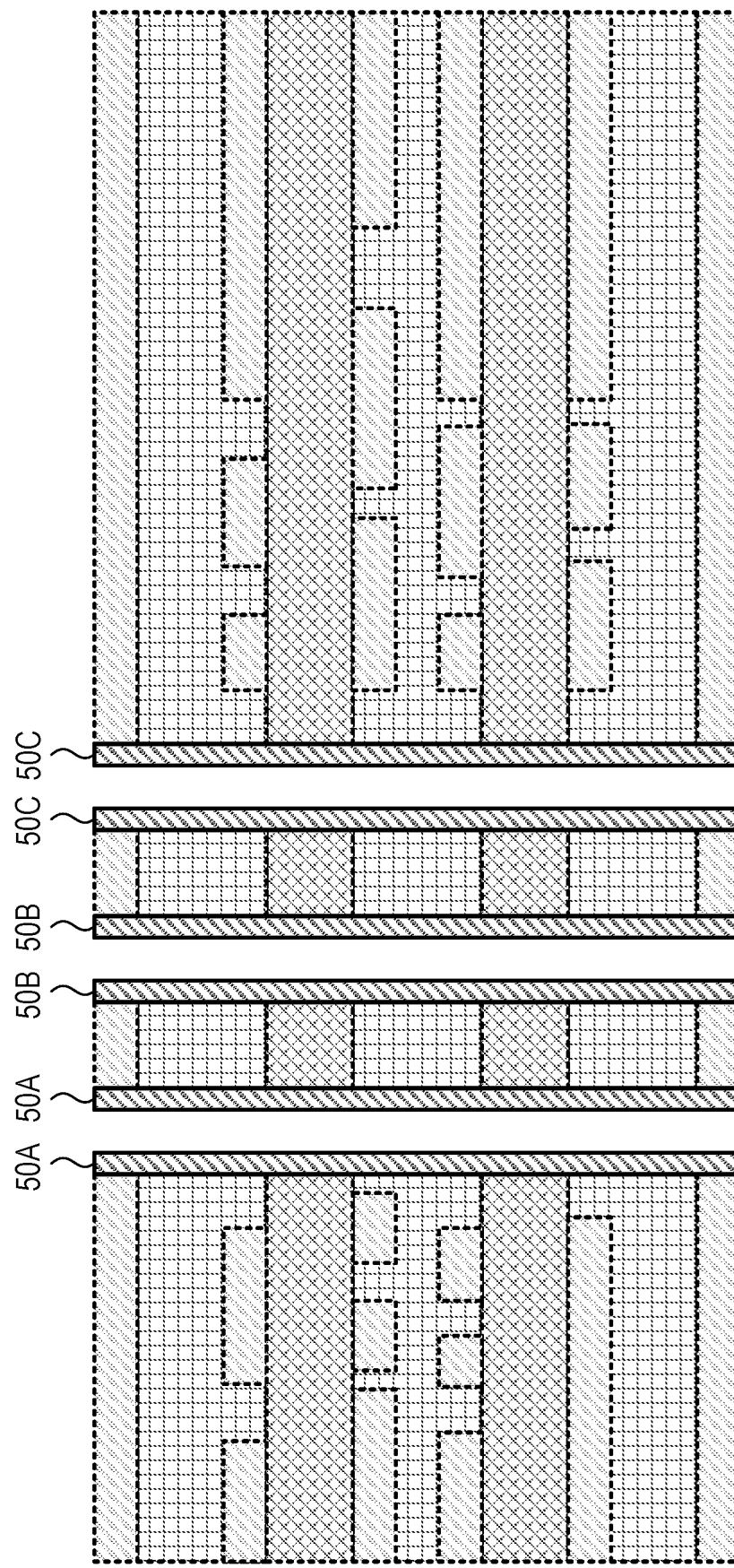

FIG. 5 shows a cross-sectional side view of an example of a device under assembly, after containment layers 50A-C have been deposited inside the vertical holes 40A-C of FIG. 4, in accordance with some examples.

In some examples, the containment layers 50A-C can be formed from plating-through-hole with a suitable plating material, such as copper. Other suitable techniques and materials can also be used. The containment layers 50A-C can define vertical channels through the horizontal circuitry layer 30.

Figure 6:
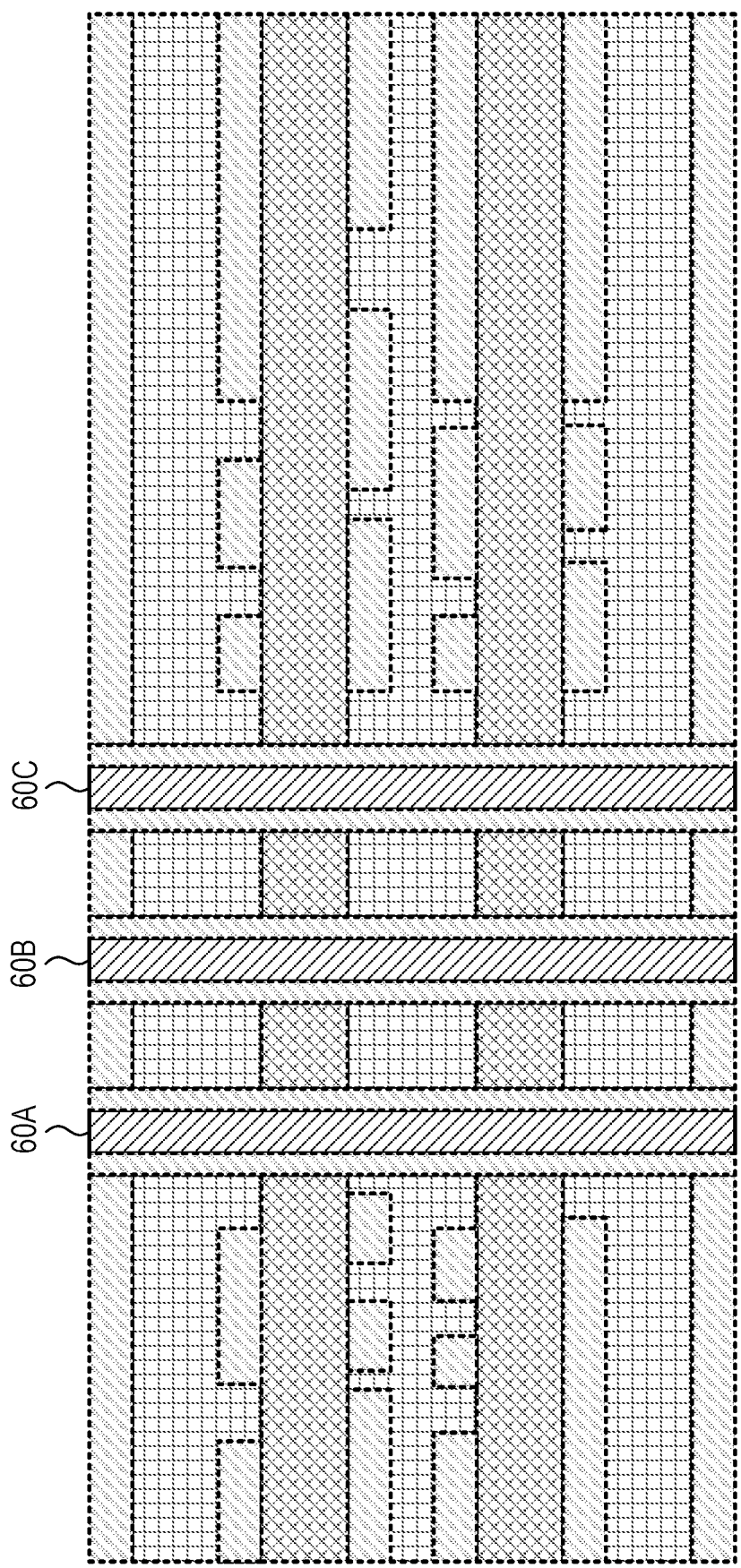

FIG. 6 shows a cross-sectional side view of an example of a device under assembly, after the vertical channels 60A-C have been filled with a first phase change material, in accordance with some examples.

Figure 7:
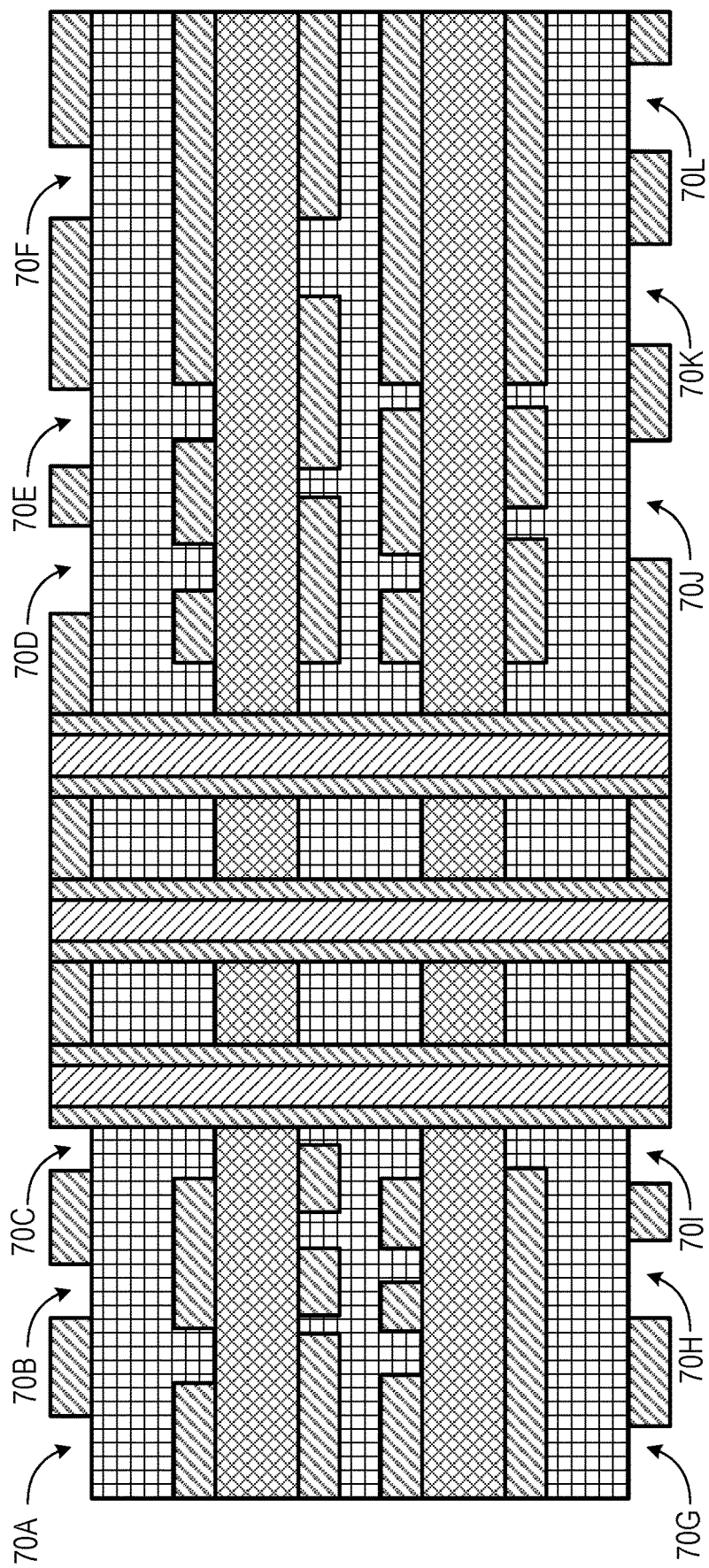

FIG. 7 shows a cross-sectional side view of an example of a device under assembly, after portions 70A-F of the first side 32 of the horizontal circuitry layer 30 and portions 70G-L of the second side 34 of the horizontal circuitry layer 30 have been removed, in accordance with some examples. The removal can be through etching, ablating, drilling, photoresist coating and exposure, or any other suitable removal mechanism. In some examples, the etched portions 70A-L can be etched fully through copper to expose prepreg material. The un-etched copper portions can form circuitry on the first side 32 and the second side 34 of the horizontal circuitry layer 30.

Figure 8:
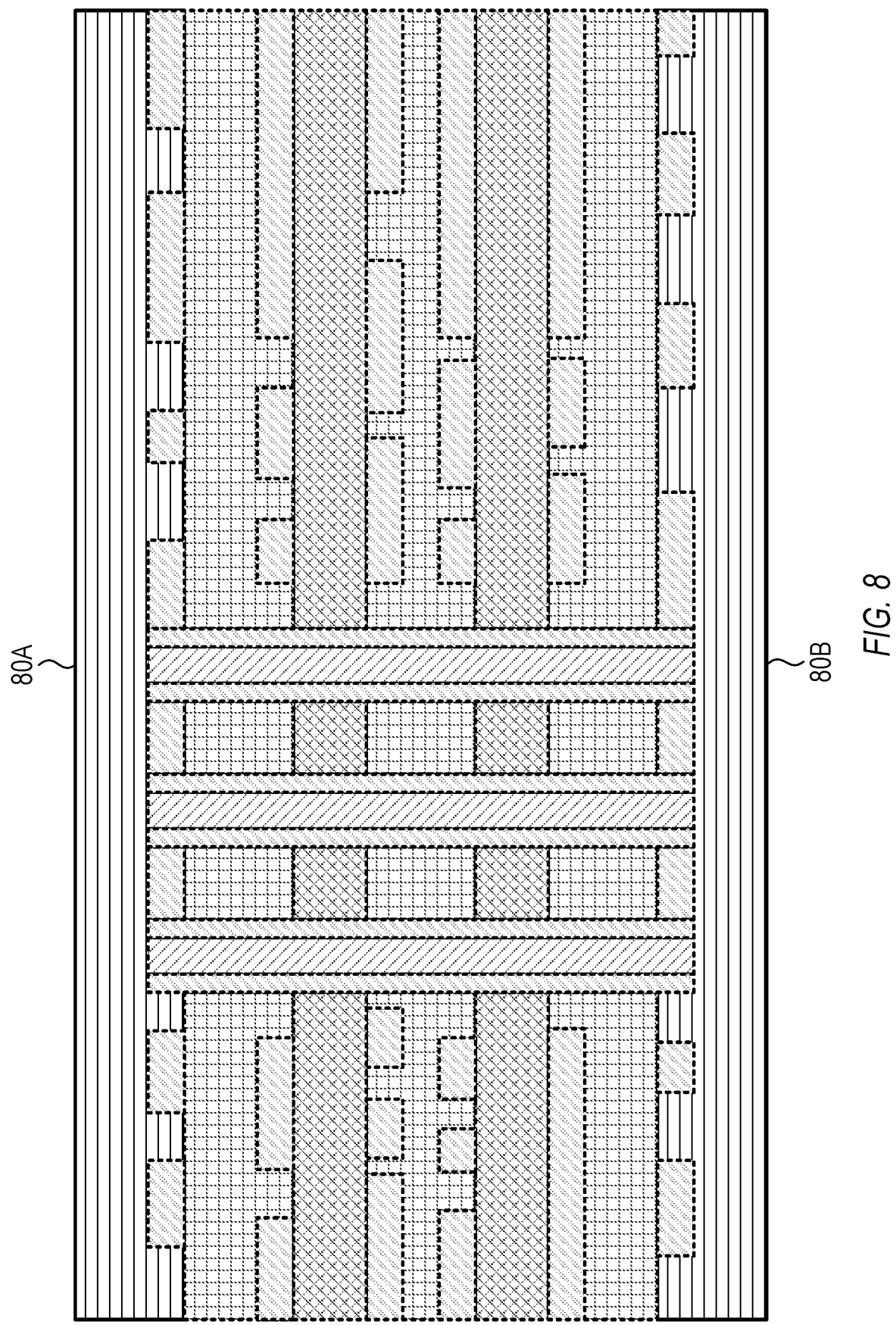

FIG. 8 shows a cross-sectional side view of an example of a device under assembly, after a dielectric film 80A has been deposited on the first side 32 of the horizontal circuitry layer 30, and after a dielectric film 80B has been deposited on the second side 34 of the horizontal circuitry layer 30, in accordance with some examples.

Figure 9:
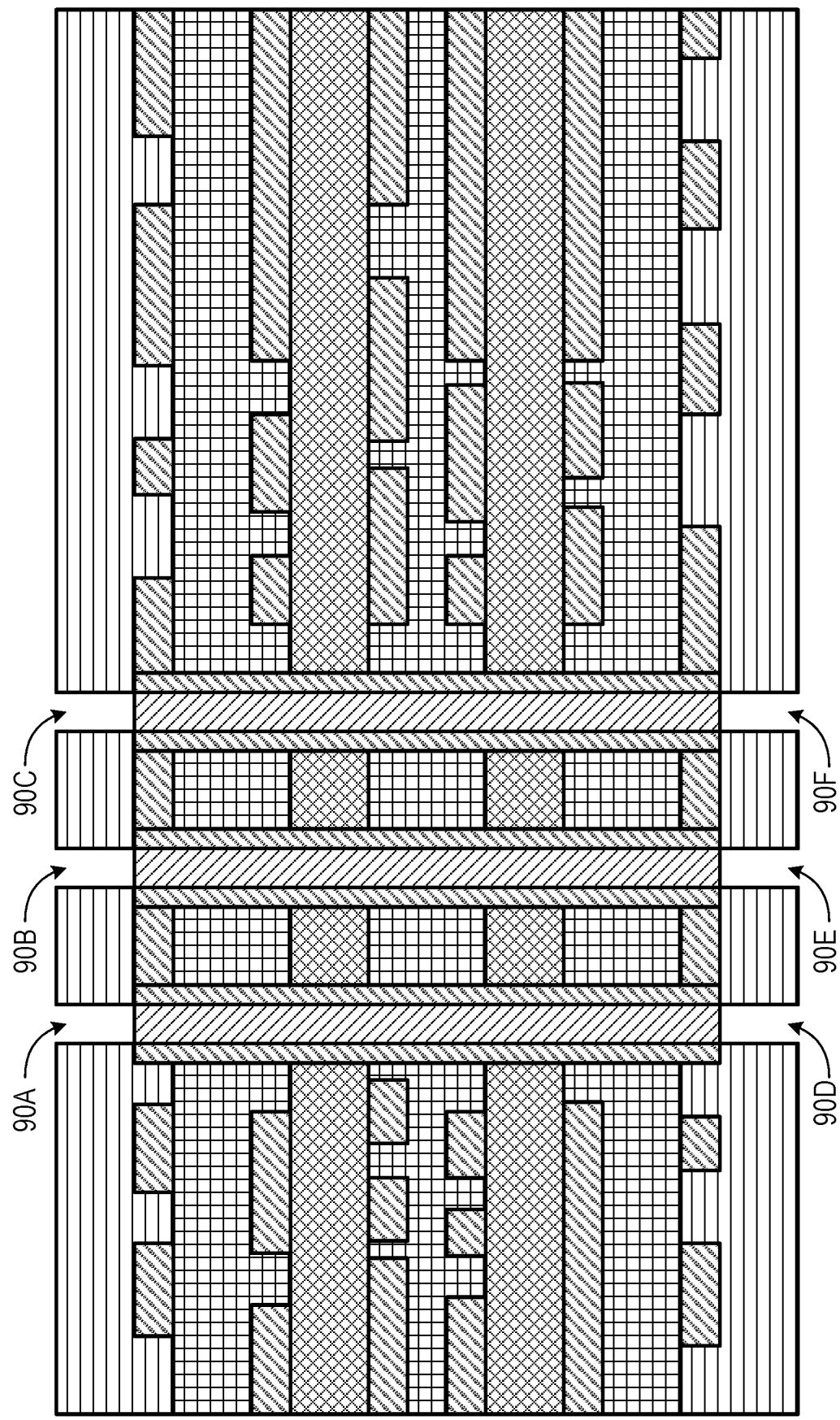

FIG. 9 shows a cross-sectional side view of an example of a device under assembly, after through holes 90A-C have been formed in the dielectric film 80A, and through holes 90D-F have been formed in the dielectric film 80B, in accordance with some examples. The through holes 90A-F can be formed by etching, ablating, drilling, photoresist coating and exposure, or any other suitable material removal mechanism. The through holes 90A-F can expose the vertical holes 40A-C.

Figure 10:
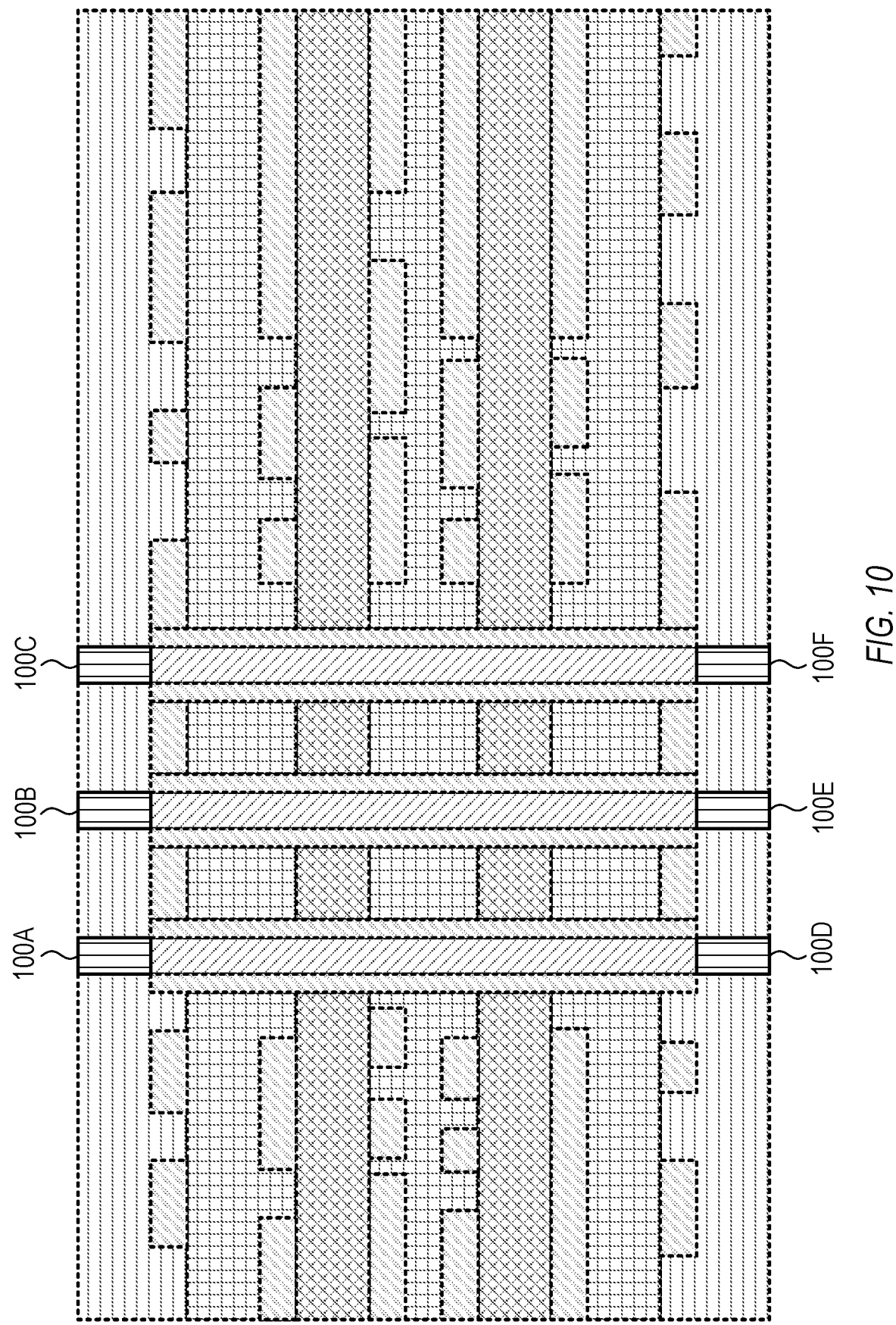

FIG. 10 shows a cross-sectional side view of an example of a device under assembly, after plugs 100A-F have been formed in the through holes 90A-F, in accordance with some examples. The plugs 100A-C can seal first ends of the vertical holes 40A-C proximate the first side 32 of the horizontal circuitry layer 30. The plugs 100A-C can thermally connect the first phase change material in the vertical channels 60A-C to the first side 32 of the horizontal circuitry layer 30. The plugs 100D-F can seal second ends of the vertical holes 40D-F proximate the second side 34 of the horizontal circuitry layer 30. The plugs 100D-F can thermally connect the first phase change material in the vertical channels 60A-C to second side 34 of the horizontal circuitry layer 30.

Figure 11:
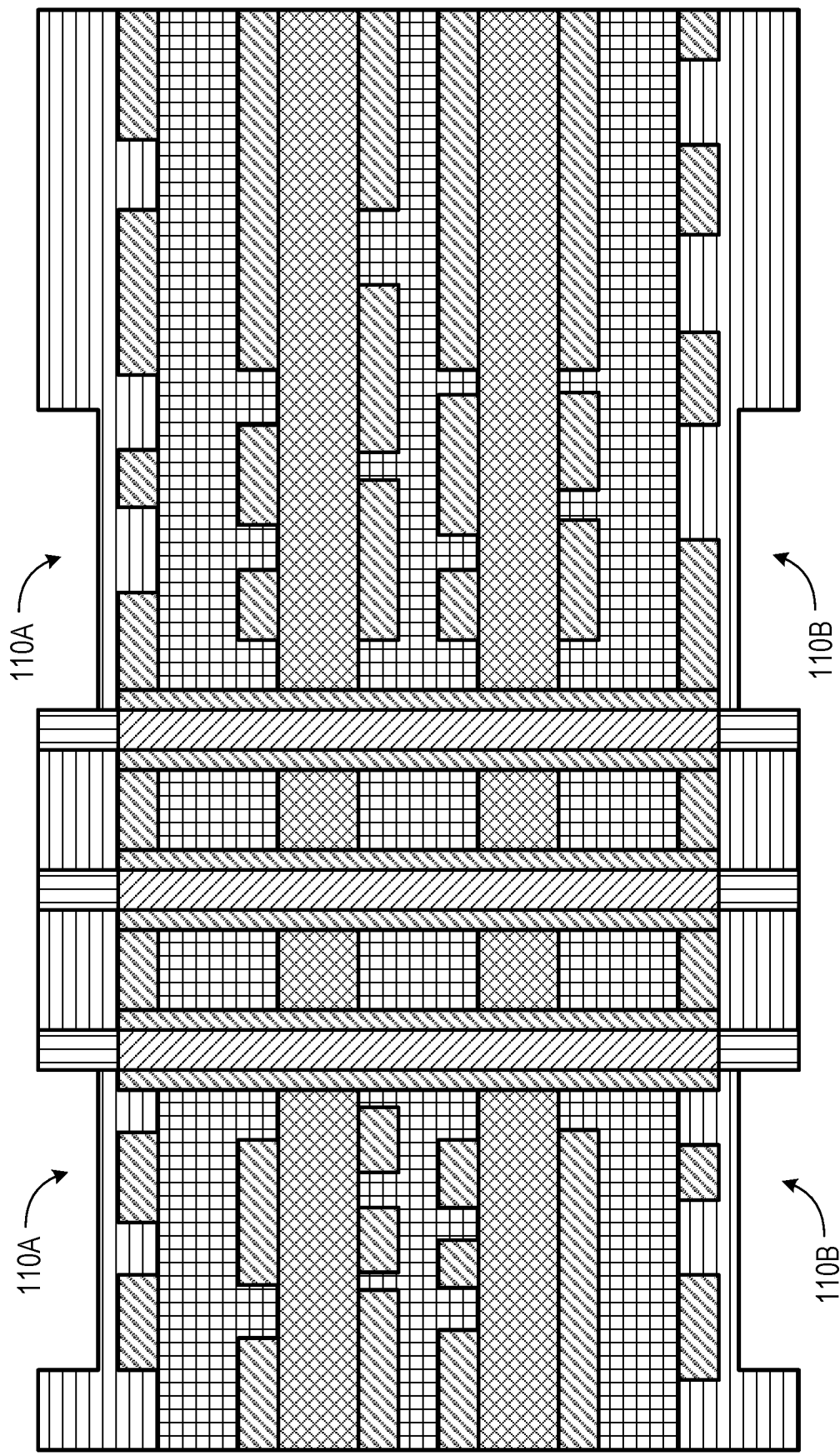

FIG. 11 shows a cross-sectional side view of an example of a device under assembly, after the dielectric film 80A has been partially removed in a horizontal trench 110A that at least partially surrounds the plugs 100A-C, and after the dielectric film 80B has been partially removed in a horizontal trench 110B that at least partially surrounds the plugs 100D-F, in accordance with some examples. The horizontal trench 110A-B can be formed by etching, ablating, drilling, photoresist coating and exposure, or any other suitable material removal mechanism.

Figure 12:
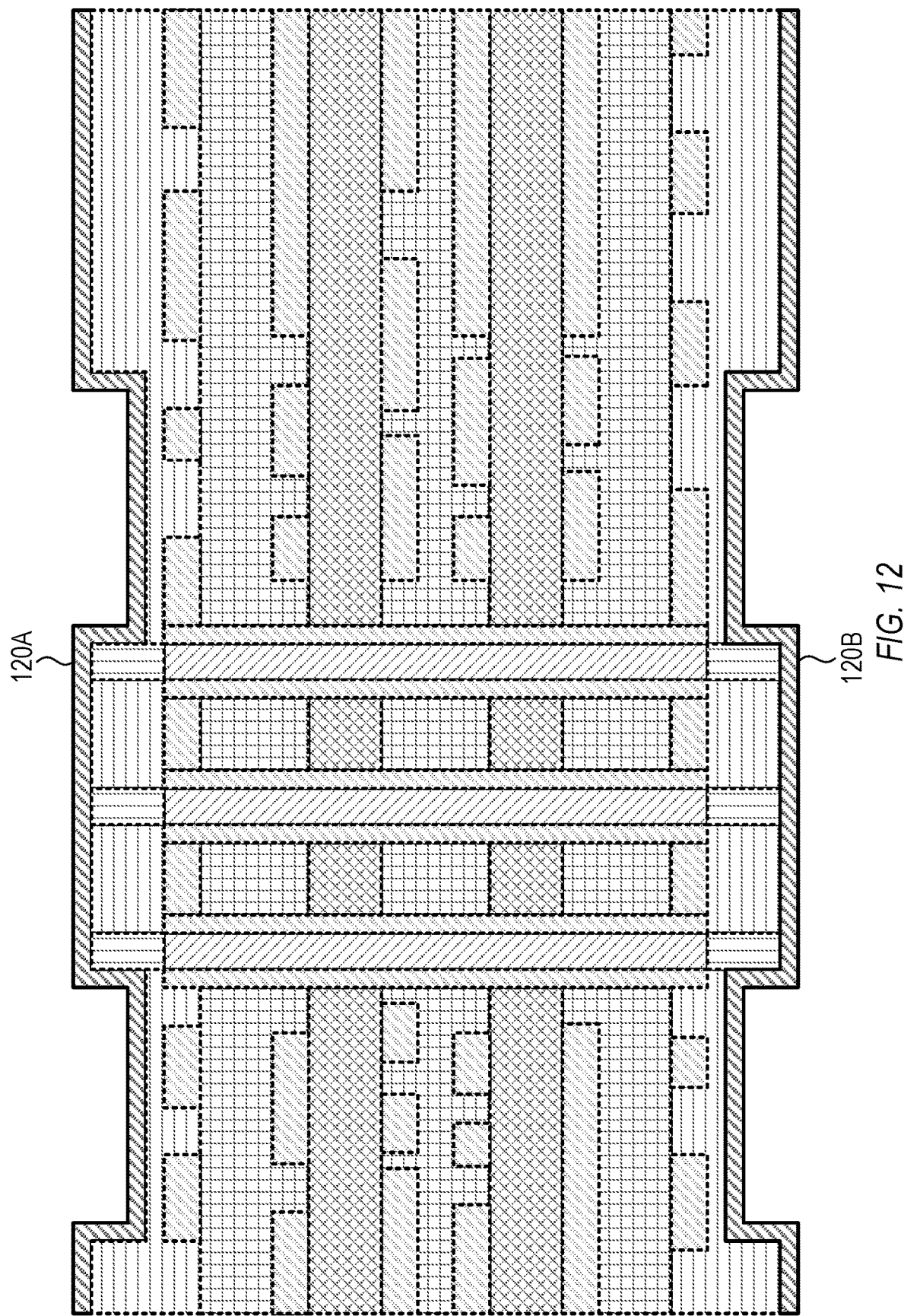

FIG. 12 shows a cross-sectional side view of an example of a device under assembly, after a first copper layer 120A has been deposited on the dielectric film 80A, and after an optional additional first copper layer 120B has been deposited on the dielectric film 80B, in accordance with some examples. The first copper layer 120A can cover the plugs 100A-C and cover the horizontal trench 110A. The optional additional first copper layer 120B can cover the plugs 100D-F and cover the horizontal trench 110B.

Figure 13:
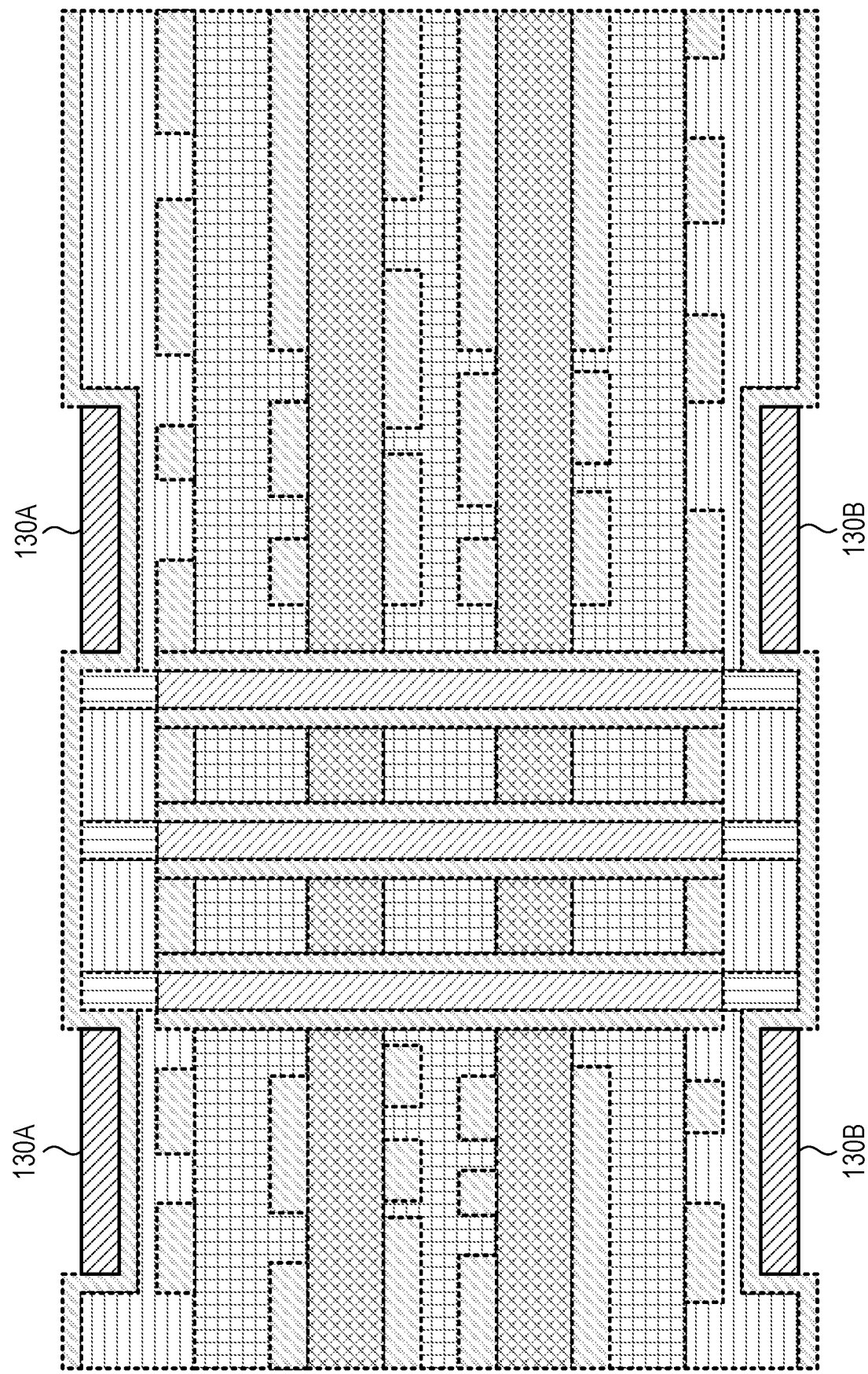

FIG. 13 shows a cross-sectional side view of an example of a device under assembly, after a second phase change material has been placed on the first copper layer 120A in the horizontal trench 110A to form a horizontal channel 130A, and after an optional additional second phase change material has been placed on the optional additional first copper layer 120B in the horizontal trench 110B to form an optional additional horizontal channel 130B, in accordance with some examples. The second phase change material can be the same as the first phase change material, or different from the phase change material.

Figure 14:
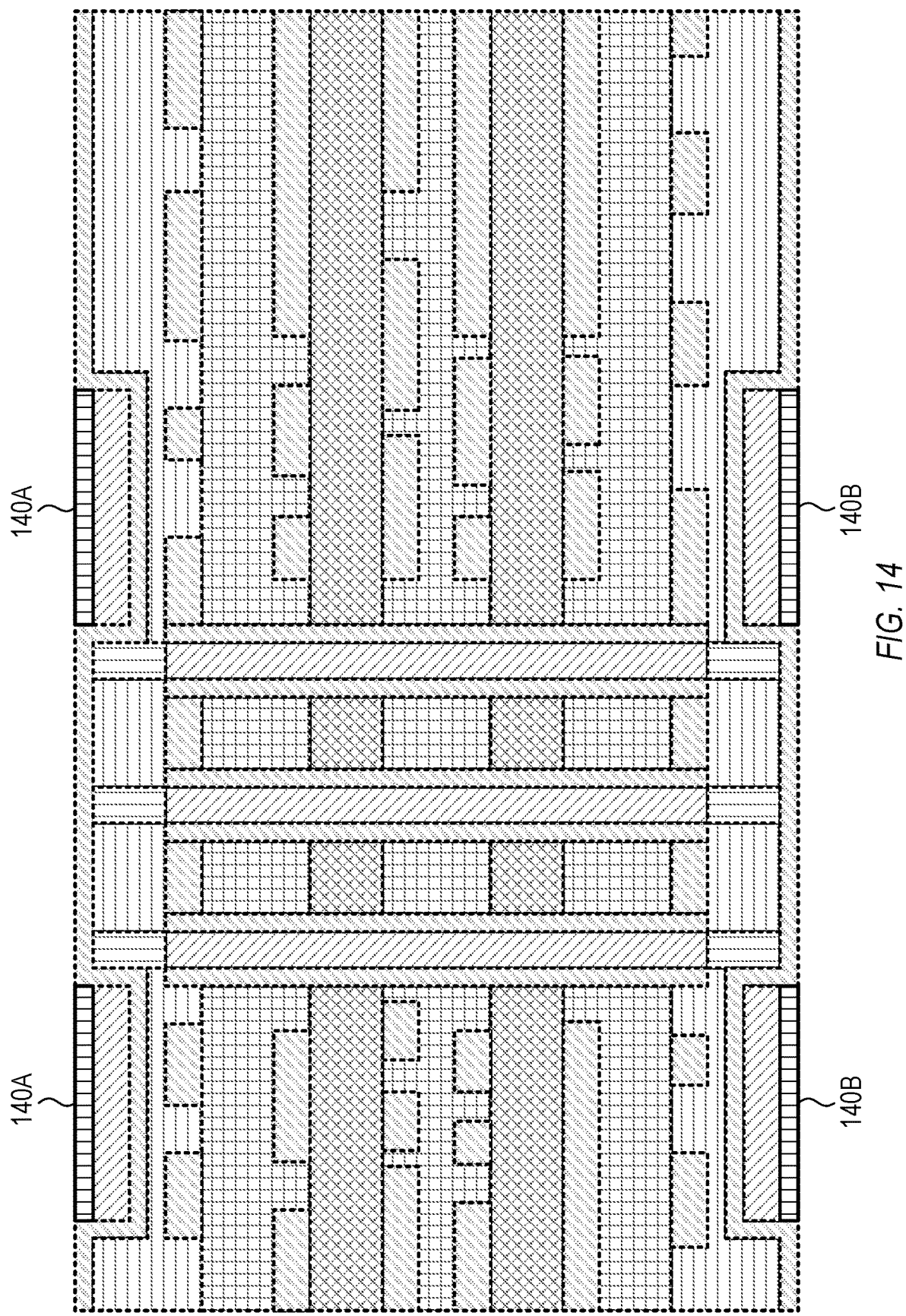

FIG. 14 shows a cross-sectional side view of an example of a device under assembly, after a cap 140A has been positioned on the horizontal channel 130A to seal the second phase change material within the horizontal channel 130A, and after a cap 140B has been positioned on the horizontal channel 130B to seal the second phase change material within the horizontal channel 130B, in accordance with some examples. In some examples, the caps 140A-B can be formed from the same material used for the plugs 100A-F. Other suitable materials can also be used.

Figure 15:
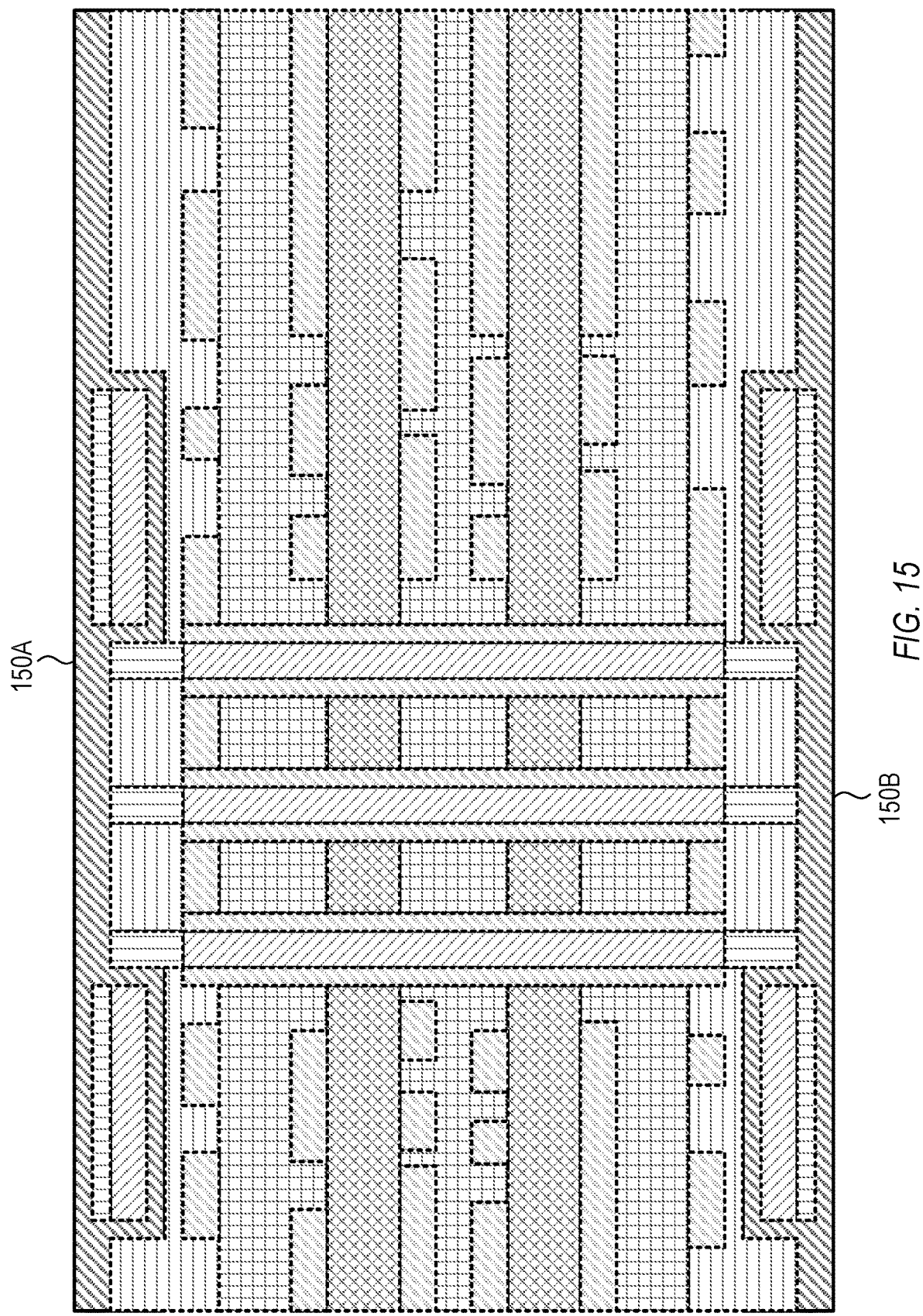

FIG. 15 shows a cross-sectional side view of an example of a device under assembly, after a second copper layer 150A has been deposited on the first copper layer 120A to cover the cap 140A and thereby surround the horizontal channel 130A and the cap 140A with copper material, and after an optional additional second copper layer 150B has been deposited on the optional additional first copper layer 120B to cover the cap 140B and thereby surround the horizontal channel 130B and the cap 140B with copper material, in accordance with some examples.

Figure 16:
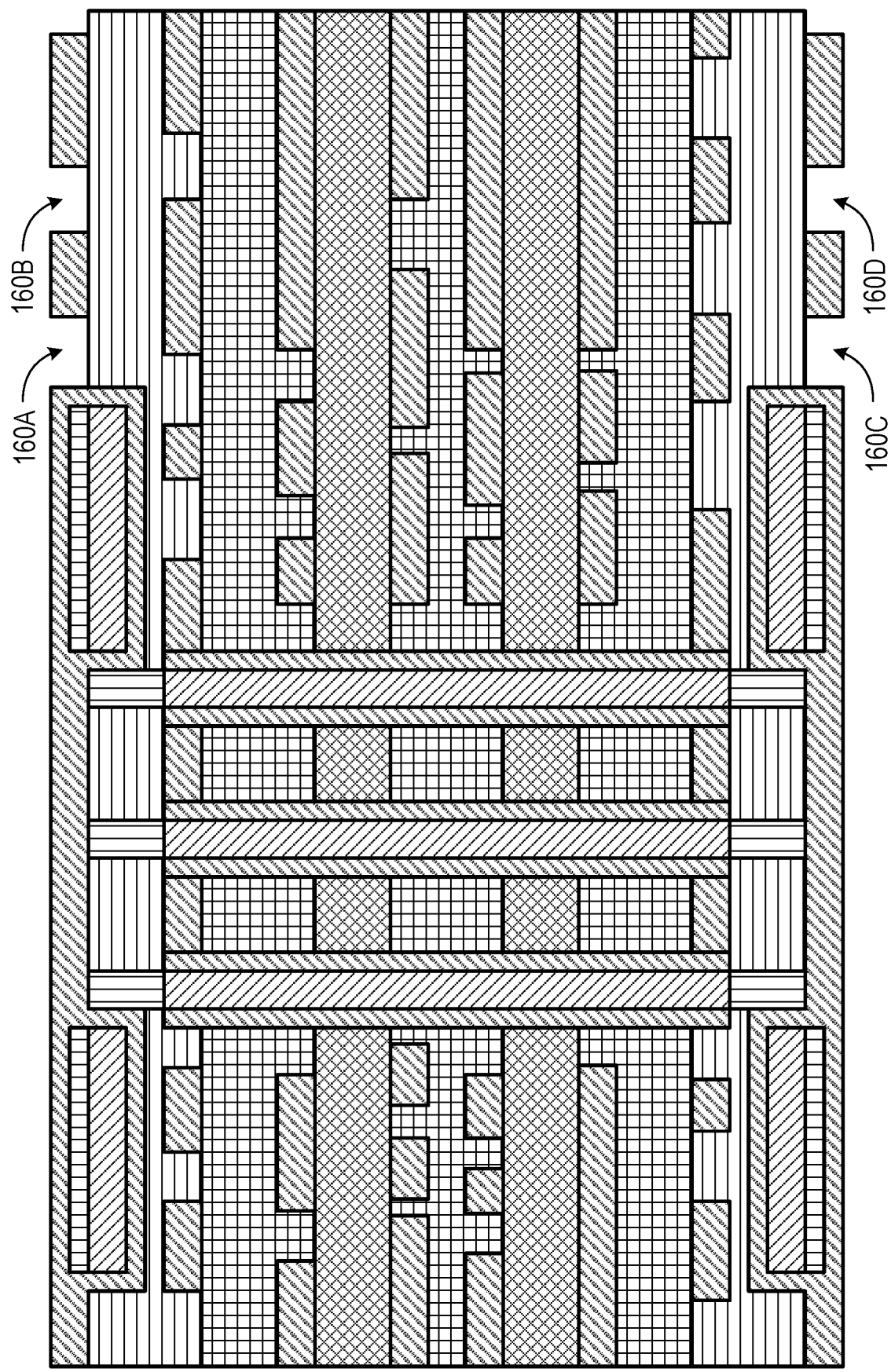

FIG. 16 shows a cross-sectional side view of an example of a device under assembly, after portions 160A-B of the second copper layer 150A and portions 160C-D of the optional additional second copper layer 150B have been removed, in accordance with some examples. The removal can be through etching, ablating, drilling, photoresist coating and exposure, or any other suitable removal mechanism. In some examples, the un-etched copper portions can form circuitry on the top and bottom sides of the device.

Figure 17:
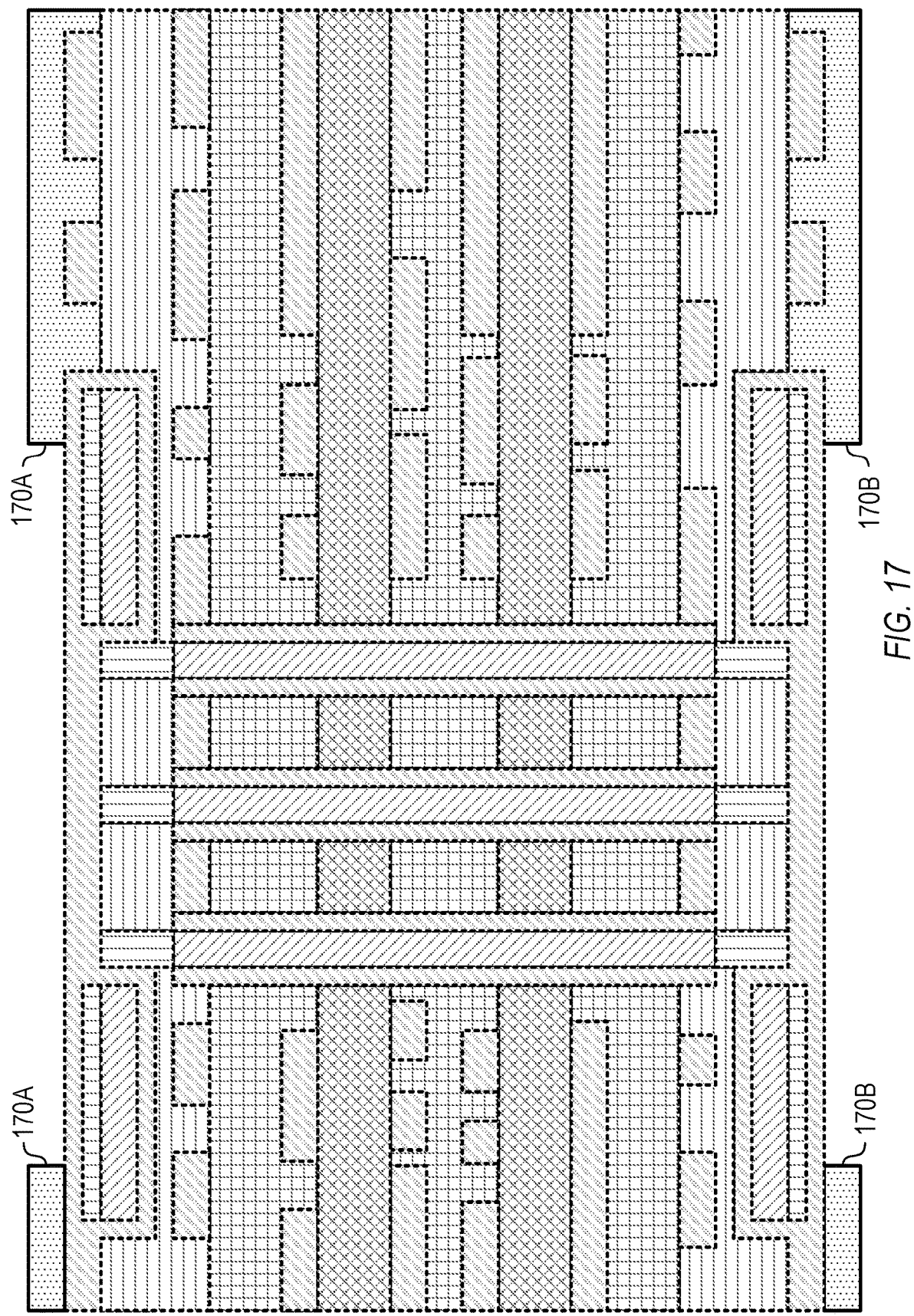

FIG. 17 shows a cross-sectional side view of an example of a device under assembly, after a solder mask 170A has been deposited on the second copper layer 150A, and an optional additional solder mask 170B has been deposited on the second copper layer 150B, in accordance with some examples. The solder mask 170A can expose the second copper layer 150A over the plugs 100A-C and over at least a portion of the cap 140A. The exposed portion of the second copper layer 150A can define a contact region configured to contact a heat-producing electrical component. Similarly, the solder mask 170B can expose the second copper layer 150B over the plugs 100D-F and over at least a portion of the cap 140B. The exposed portion of the second copper layer 150A can define a contact region configured to contact a heat sink or other suitable component.

Figure 18:
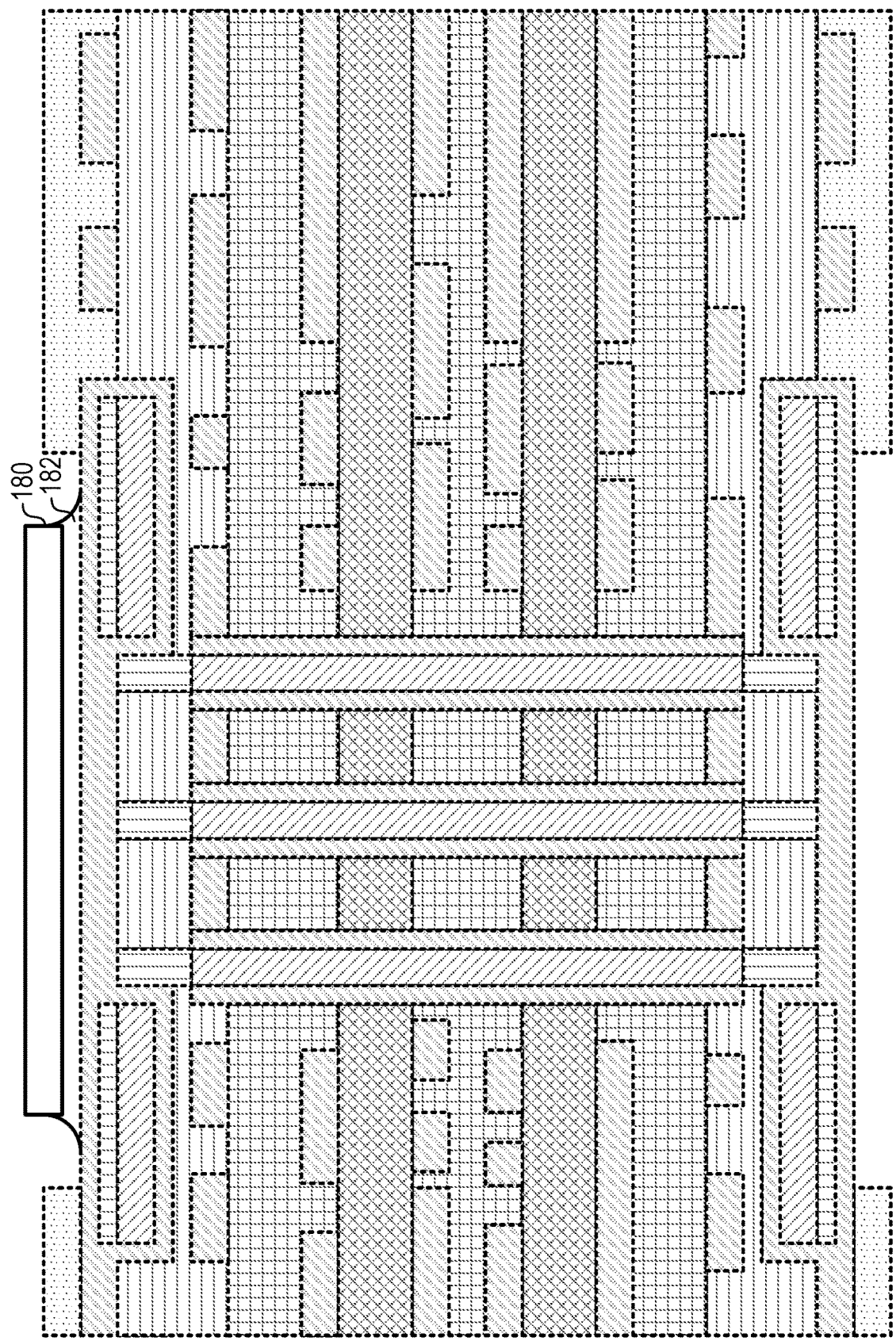

FIG. 18 shows a cross-sectional side view of an example of a completed device, in contact with a heat-producing electrical component 180, in accordance with some examples. The heat-producing electrical component 180 can be attached to the contact region (e.g., the exposed portion of the second copper layer 150A) in any suitable manner, such as with thermally conducting paste 182.

The assembly process shown FIGS. 2-18 is but one example of an assembly process that can produce the device 10 of FIG. 1. Other suitable assembly processes can also be used.

Figure 19:
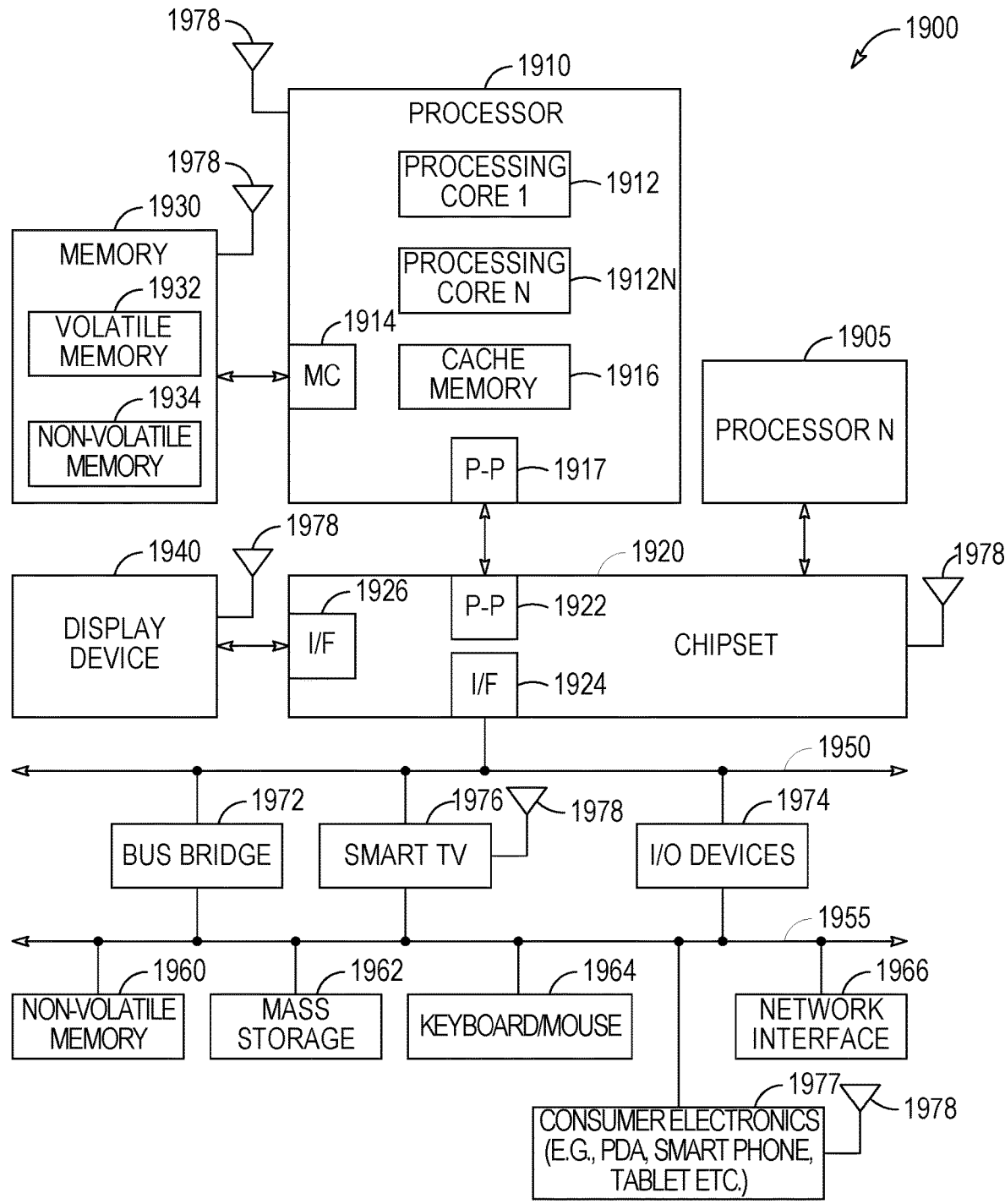
FIG. 19 illustrates a system level diagram, depicting an example of an electronic device (e.g., system) including the device and system as described in the present disclosure.

FIG. 19 illustrates a system level diagram, depicting an example of an electronic device (e.g., system) including the device and system as described in the present disclosure. FIG. 19 is included to show an example of a higher-level device application for the device and system. In one embodiment, system 1900 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1900 is a system on a chip (SOC) system.

In one embodiment, processor 1910 has one or more processor cores 1912 and 1912N, where 1912N represents the Nth processor core inside processor 1910 where N is a positive integer. In one embodiment, system 1900 includes multiple processors including 1910 and 1905, where processor 1905 has logic similar or identical to the logic of processor 1910. In some embodiments, processing core 1912 includes, but is not limited to, pre-fetch logic to fetch instructions, decode logic to decode the instructions, execution logic to execute instructions and the like. In some embodiments, processor 1910 has a cache memory 1916 to cache instructions and/or data for system 1900. Cache memory 1916 may be organized into a hierarchal structure including one or more levels of cache memory.

In some embodiments, processor 1910 includes a memory controller 1914, which is operable to perform functions that enable the processor 1910 to access and communicate with memory 1930 that includes a volatile memory 1932 and/or a non-volatile memory 1934. In some embodiments, processor 1910 is coupled with memory 1930 and chipset 1920. Processor 1910 may also be coupled to a wireless antenna 1978 to communicate with any device configured to transmit and/or receive wireless signals. In one embodiment, an interface for wireless antenna 1978 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 1932 includes, but is not limited to, Synchronous Dynamic Random-Access Memory (SDRAM), Dynamic Random-Access Memory (DRAM), RAMBUS Dynamic Random-Access Memory (RDRAM), and/or any other type of random access memory device. Non-volatile memory 1934 includes, but is not limited to, flash memory, phase change memory (PCM), read-only memory (ROM), electrically erasable programmable read-only memory (EEPROM), or any other type of non-volatile memory device.

Memory 1930 stores information and instructions to be executed by processor 1910. In one embodiment, memory 1930 may also store temporary variables or other intermediate information while processor 1910 is executing instructions. In the illustrated embodiment, chipset 1920 connects with processor 1910 via Point-to-Point (PtP or P-P) interfaces 1917 and 1922. Chipset 1920 enables processor 1910 to connect to other elements in system 1900. In some embodiments of the example system, interfaces 1917 and 1922 operate in accordance with a PtP communication protocol such as the Intel® QuickPath Interconnect (QPI) or the like. In other embodiments, a different interconnect may be used.

In some embodiments, chipset 1920 is operable to communicate with processor 1910, 1905N, display device 1940, and other devices, including a bus bridge 1972, a smart TV 1976, I/O devices 1974, nonvolatile memory 1960, a storage medium (such as one or more mass storage devices) 1962, a keyboard/mouse 1964, a network interface 1966, and various forms of consumer electronics 1977 (such as a PDA, smart phone, tablet etc.), etc. In one embodiment, chipset 1920 couples with these devices through an interface 1924. Chipset 1920 may also be coupled to a wireless antenna 1978 to communicate with any device configured to transmit and/or receive wireless signals.

Chipset 1920 connects to display device 1940 via interface 1926. Display 1940 may be, for example, a liquid crystal display (LCD), a light emitting diode (LED) array, an organic light emitting diode (OLED) array, or any other form of visual display device. In some embodiments of the example system, processor 1910 and chipset 1920 are merged into a single SOC. In addition, chipset 1920 connects to one or more buses 1950 and 1955 that interconnect various system elements, such as I/O devices 1974, nonvolatile memory 1960, storage medium 1962, a keyboard/mouse 1964, and network interface 1966. Buses 1950 and 1955 may be interconnected together via a bus bridge 1972.

In one embodiment, mass storage device 1962 includes, but is not limited to, a solid-state drive, a hard disk drive, a universal serial bus flash memory drive, or any other form of computer data storage medium. In one embodiment, network interface 1966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 19 are depicted as separate blocks within the system 1900, the functions performed by some of these blocks may be integrated within a single semiconductor circuit or may be implemented using two or more separate integrated circuits. For example, although cache memory 1916 is depicted as a separate block within processor 1910, cache memory 1916 (or selected aspects of 1916) can be incorporated into processor core 1912.

In some examples, the device of FIG. 19 can include a silicon photonic device, which can benefit from good heat dissipation. In some examples, the silicon photonic device can include a transmitter, which can include a laser diode that can convert an electrical data signal to an optical data signal, and can generate a substantial amount of heat. In some examples, the silicon photonic device can include a receiver, which can include a detector that can convert an optical data signal to an electrical data signal, and can also generate a substantial amount of heat. Both a transmitter and a receiver can benefit from efficient heat dissipation, as explained above.

Figure 20:
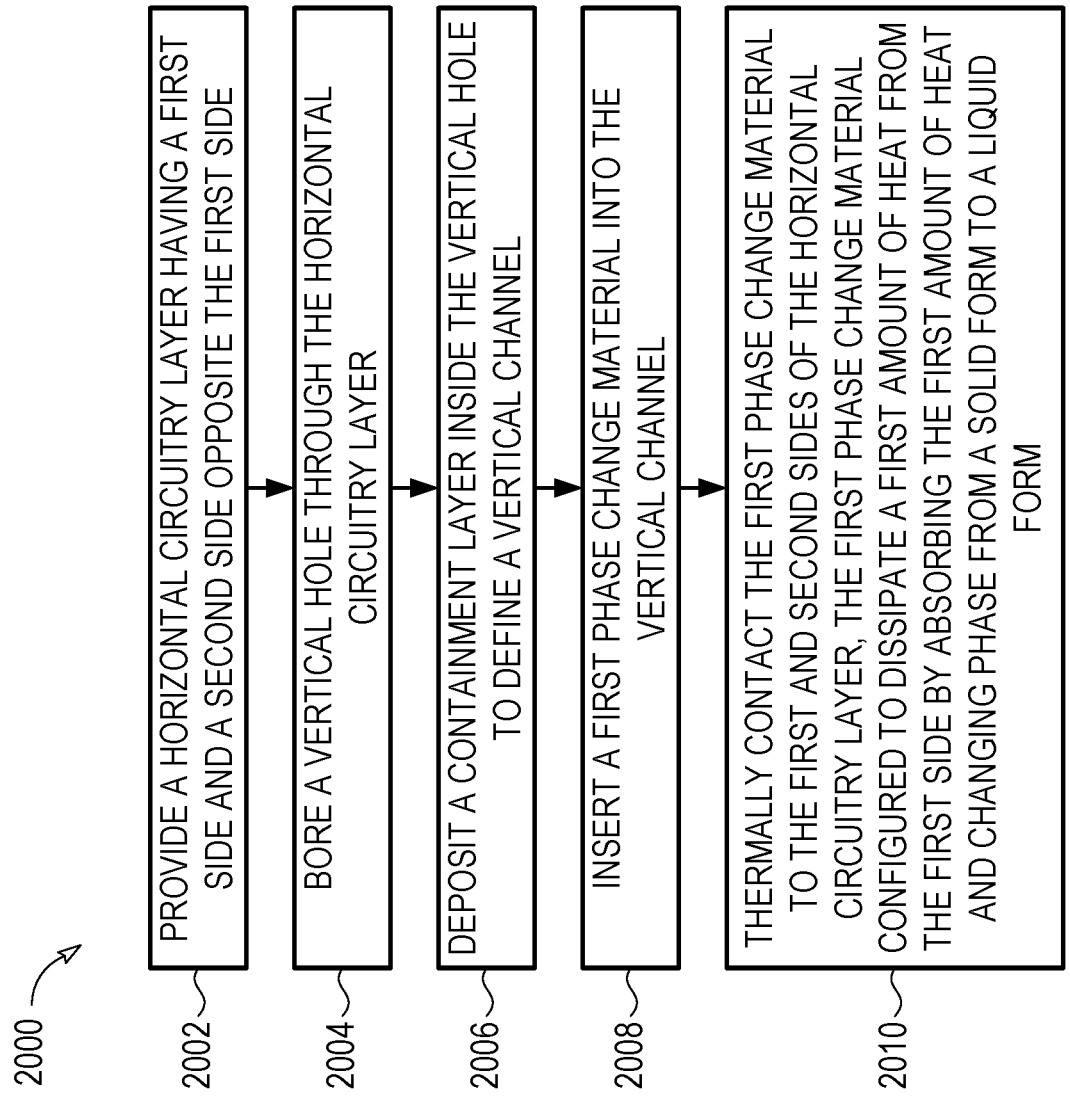
FIG. 20 shows a flowchart of an example of a method for manufacturing a device that can dissipate heat from an electrical component by using a phase change material, in accordance with some examples.

FIG. 20 shows a flowchart of an example of a method 2000 for manufacturing a device that can dissipate heat from an electrical component by using a phase change material, in accordance with some examples. The method 2000 is suitable for manufacturing the device 10 of FIG. 1, as well as other devices. The method 2000 is but one suitable method for manufacturing a device that can dissipate heat from an electrical component by using a phase change material; other suitable methods can also be used.

At operation 2002, one can provide a horizontal circuitry layer having a first side and a second side opposite the first side.

At operation 2004, one can bore a vertical hole through the horizontal circuitry layer.

At operation 2006, one can deposit a containment layer inside the vertical hole to define a vertical channel.

At operation 2008, one can insert a first phase change material into the vertical channel.

At operation 2010, one can thermally contact the first phase change material to the first and second sides of the horizontal circuitry layer, the first phase change material configured to dissipate a first amount of heat from the first side by absorbing the first amount of heat and changing phase from a solid form to a liquid form.

In the foregoing detailed description, the method and apparatus of the present disclosure have been described with reference to specific embodiments thereof. It will, however, be evident that various modifications and changes may be made thereto without departing from the broader spirit and scope of the present disclosure. The present specification and figures are accordingly to be regarded as illustrative rather than restrictive.

To further illustrate the device and related method disclosed herein, a non-limiting list of examples is provided below. Each of the following non-limiting examples can stand on its own, or can be combined in any permutation or combination with any one or more of the other examples.

In Example 1, a device can include: a horizontal circuitry layer having a first side and a second side opposite the first side; a vertical hole extending through the horizontal circuitry layer; and a vertical channel comprising a first phase change material positioned in the vertical hole and in thermal contact with the first and second sides of the horizontal circuitry layer, the first phase change material configured to dissipate a first amount of heat from the first side by absorbing the first amount of heat and changing phase from a solid form to a liquid form.

In Example 2, the device of Example 1 can optionally be configured such that the first phase change material, when in the liquid form, is configured to dissipate a second amount of heat from the first side by transporting the second amount of heat via convection from the first side of the horizontal circuitry layer to the second side of the horizontal circuitry layer.

In Example 3, the device of any one of Examples 1-2 can optionally be configured such that the first phase change material is in the solid form at room temperature.

In Example 4, the device of any one of Examples 1-3 can optionally be configured such that the first phase change material is a thermoresponsive gel.

In Example 5, the device of any one of Examples 1-4 can optionally be configured such that the vertical hole is formed as a bore through the horizontal circuitry layer, and optionally further including a containment layer disposed inside the bore, such that the containment layer defines an interior of the vertical channel and contacts the first phase change material in the vertical channel.

In Example 6, the device of any one of Examples 1-5 can optionally further include: a dielectric film disposed on the first side of the horizontal circuitry layer, the dielectric film including a through hole that exposes the vertical hole; and a plug disposed in the through hole of the dielectric film, the plug configured to seal a first end of the vertical hole proximate the first side of the horizontal circuitry layer, the plug thermally connecting the first phase change material in the vertical channel to the first side of the horizontal circuitry layer.

In Example 7, the device of any one of Examples 1-6 can optionally be configured such that the dielectric film is partially removed in a horizontal trench that at least partially surrounds the plug; and optionally further include a first copper layer positioned on the dielectric film, the first copper layer covering the plug and covering the horizontal trench.

In Example 8, the device of any one of Examples 1-7 can optionally further include: a horizontal channel comprising a second phase change material positioned on the first copper layer in the horizontal trench; and a cap positioned on the horizontal channel and configured to seal the second phase change material within the horizontal channel.

In Example 9, the device of any one of Examples 1-8 can optionally be configured such that the second phase change material is the same as the first phase change material.

In Example 10, the device of any one of Examples 1-9 can optionally further include: a second copper layer disposed on the first copper layer, the second copper layer covering the cap and thereby surrounding the horizontal channel and the cap with copper material.

In Example 11, the device of any one of Examples 1-10 can optionally further include: a solder mask disposed on the second copper layer, the solder mask exposing the second copper layer over the plug and over at least a portion of the cap, the exposed portion of the second copper layer defining a contact region configured to contact a heat-producing electrical component.

In Example 12, the device of any one of Examples 1-11 can optionally be configured such that the horizontal circuitry layer includes a plurality of inner circuit layers; each inner circuit layer is separated from an adjacent inner circuit layer by a spacer layer; and the vertical hole extends through each inner circuit layer of the plurality of inner circuit layers and through each spacer layer.

In Example 13, the device of any one of Examples 1-12 can optionally be configured such that the vertical hole is one of a plurality of vertical holes extending through the horizontal circuitry layer; and each vertical hole of the plurality of vertical holes is filled with the phase change material, such that the phase change material in each vertical hole is in thermal contact with the first and second sides of the horizontal circuitry layer.

In Example 14, a method can include: providing a horizontal circuitry layer having a first side and a second side opposite the first side; boring a vertical hole through the horizontal circuitry layer; depositing a containment layer inside the vertical hole to define a vertical channel; inserting a first phase change material into the vertical channel; and thermally contacting the first phase change material to the first and second sides of the horizontal circuitry layer, the first phase change material configured to dissipate a first amount of heat from the first side by absorbing the first amount of heat and changing phase from a solid form to a liquid form.

In Example 15, the method of Example 14 can optionally further include: depositing a dielectric film on the first side of the horizontal circuitry layer, the dielectric film including a through hole that exposes the vertical hole; and forming a plug in the through hole of the dielectric film to seal a first end of the vertical hole proximate the first side of the horizontal circuitry layer, the plug thermally connecting the first phase change material in the vertical channel to the first side of the horizontal circuitry layer.

In Example 16, the method of any one of Examples 14-15 can optionally further include: partially removing the dielectric film in a horizontal trench that at least partially surrounds the plug; and depositing a first copper layer on the dielectric film, the first copper layer covering the plug and covering the horizontal trench.

In Example 17, the method of any one of Examples 14-16 can optionally further include: placing a second phase change material on the first copper layer in the horizontal trench to form a horizontal channel; and positioning a cap on the horizontal channel to seal the second phase change material within the horizontal channel.

In Example 18, the method of any one of Examples 14-17 can optionally further include: depositing a second copper layer on the first copper layer to cover the cap and thereby surround the horizontal channel and the cap with copper material; and depositing a solder mask on the second copper layer, the solder mask exposing the second copper layer over the plug and over at least a portion of the cap, the exposed portion of the second copper layer defining a contact region configured to contact a heat-producing electrical component.

In Example 19, a device can include: a horizontal circuitry layer having a first side and a second side opposite the first side; a vertical hole formed as a bore extending through the horizontal circuitry layer; a vertical channel comprising a first phase change material positioned in the vertical hole and in thermal contact with the first and second sides of the horizontal circuitry layer, the first phase change material being a thermoresponsive gel that is a solid at room temperature, the first phase change material configured to dissipate a first amount of heat from the first side by absorbing the first amount of heat and changing phase from a solid form to a liquid form, the first phase change material, when in the liquid form, configured to dissipate a second amount of heat from the first side by transporting the second amount of heat via convection from the first side of the horizontal circuitry layer to the second side of the horizontal circuitry layer; a containment layer disposed inside the bore, such that the containment layer defines an interior of the vertical channel and contacts the first phase change material in the vertical channel; a dielectric film disposed on the first side of the horizontal circuitry layer, the dielectric film including a through hole that exposes the vertical hole; a plug disposed in the through hole of the dielectric film, the plug configured to seal a first end of the vertical hole proximate the first side of the horizontal circuitry layer, the plug thermally connecting the first phase change material in the vertical channel to the first side of the horizontal circuitry layer, the dielectric film being partially removed in a horizontal trench that at least partially surrounds the plug; a first copper layer positioned on the dielectric film, the first copper layer covering the plug and covering the horizontal trench; a horizontal channel comprising a second phase change material positioned on the first copper layer in the horizontal trench; a cap positioned on the horizontal channel and configured to seal the second phase change material within the horizontal channel; a second copper layer disposed on the first copper layer, the second copper layer covering the cap and thereby surrounding the horizontal channel and the cap with copper material; and a solder mask disposed on the second copper layer, the solder mask exposing the second copper layer over the plug and over at least a portion of the cap, the exposed portion of the second copper layer defining a contact region configured to contact a heat-producing electrical component.

In Example 20, the device of Example 19 can optionally be configured such that the second phase change material is the same as the first phase change material.

What is claimed is:

1. A device, comprising:
   a horizontal circuitry layer having a first side and a second side opposite the first side;
   a vertical hole is formed as a bore extending through the horizontal circuitry layer; a vertical channel comprising a first phase change material positioned in the vertical hole and in thermal contact with the first and second sides of the horizontal circuitry layer, the first phase change material configured to dissipate a first amount of heat from the first side by absorbing the first amount of heat and changing phase from a solid form to a liquid form;
   a containment layer disposed inside the bore, such that the containment layer defines an interior of the vertical channel and contacts the first phase change material in the vertical channel;
   a dielectric film disposed on the first side of the horizontal circuitry layer, the dielectric film including a through hole that exposes the vertical hole; and
   a plug disposed in the through hole of the dielectric film, the plug configured to seal a first end of the vertical hole proximate the first side of the horizontal circuitry layer, the plug thermally connecting the first phase change material in the vertical channel to the first side of the horizontal circuitry layer, wherein the dielectric film is partially removed in a horizontal trench that at least partially surrounds the plug; and the device further comprising a first copper layer positioned on the dielectric film, the first copper layer covering the plug and covering the horizontal trench.

2. The device of claim 1, wherein the first phase change material, when in the liquid form, is configured to dissipate a second amount of heat from the first side by transporting the second amount of heat via convection from the first side of the horizontal circuitry layer to the second side of the horizontal circuitry layer.

3. The device of claim 1, wherein the first phase change material is in the solid form at room temperature.

4. The device of claim 1, wherein the first phase change material is a thermoresponsive gel.

5. The device of claim 1, further comprising:
   a horizontal channel comprising a second phase change material positioned on the first copper layer in the horizontal trench; and
   a cap positioned on the horizontal channel and configured to seal the second phase change material within the horizontal channel.

6. The device of claim 5, wherein the second phase change material is the same as the first phase change material.

7. The device of claim 5, further comprising:
   a second copper layer disposed on the first copper layer, the second copper layer covering the cap and thereby surrounding the horizontal channel and the cap with copper material.

8. The device of claim 7, further comprising:
   a solder mask disposed on the second copper layer, the solder mask exposing the second copper layer over the plug and over at least a portion of the cap, the exposed portion of the second copper layer defining a contact region configured to contact a heat-producing electrical component.

9. The device of claim 1, wherein:
the horizontal circuitry layer includes a plurality of inner circuit layers;
each of the inner circuit layers is separated from an adjacent one of the inner circuit layers by a spacer layer; and
the vertical hole extends through each of the plurality of inner circuit layers and through each spacer layer.

10. The device of claim 1, wherein:
the vertical hole is one of a plurality of vertical holes extending through the horizontal circuitry layer; and
each vertical hole of the plurality of vertical holes is filled with the first phase change material, such that the first phase change material in each vertical hole is in the thermal contact with the first and second sides of the horizontal circuitry layer.

11. A method, comprising:
providing a horizontal circuitry layer having a first side and a second side opposite the first side;
boring a vertical hole through the horizontal circuitry layer;
depositing a containment layer inside the vertical hole to define a vertical channel;
inserting a first phase change material into the vertical channel; thermally contacting the first phase change material to the first and second sides of the horizontal circuitry layer, the first phase change material configured to dissipate a first amount of heat from the first side by absorbing the first amount of heat and changing phase from a solid form to a liquid form; depositing a dielectric film on the first side of the horizontal circuitry layer, the dielectric film including a through hole that exposes the vertical hole; and forming a plug in the through hole of the dielectric film to seal a first end of the vertical hole proximate the first side of the horizontal circuitry layer, the plug thermally connecting the first phase change material in the vertical channel to the first side of the horizontal circuitry layer;
partially removing the dielectric film in a horizontal trench that at least partially surrounds the plug; and
deposing a first copper layer on the dielectric film, the first copper layer covering the plug and covering the horizontal trench.

12. The method of claim 11 further comprising:
placing a second phase change material on the first copper layer in the horizontal trench to form a horizontal channel; and
positioning a cap on the horizontal channel to seal the second phase change material within the horizontal channel.

13. The method of claim 12, further comprising:
depositing a second copper layer on the first copper layer to cover the cap and thereby surround the horizontal channel and the cap with copper material; and
depositing a solder mask on the second copper layer, the solder mask exposing the second copper layer over the plug and over at least a portion of the cap, the exposed portion of the second copper layer defining a contact region configured to contact a heat-producing electrical component.

14. A device, comprising:
a horizontal circuitry layer having a first side and a second side opposite the first side;
a vertical hole formed as a bore extending through the horizontal circuitry layer;
a vertical channel comprising a first phase change material positioned in the vertical hole and in thermal contact with the first and second sides of the horizontal circuitry layer, the first phase change material being a thermoresponsive gel that is a solid at room temperature, the first phase change material configured to dissipate a first amount of heat from the first side by absorbing the first amount of heat and changing phase from a solid form to a liquid form, the first phase change material, when in the liquid form, configured to dissipate a second amount of heat from the first side by transporting the second amount of heat via convection from the first side of the horizontal circuitry layer to the second side of the horizontal circuitry layer;
a containment layer disposed inside the bore, such that the containment layer defines an interior of the vertical channel and contacts the first phase change material in the vertical channel;
a dielectric film disposed on the first side of the horizontal circuitry layer, the dielectric film including a through hole that exposes the vertical hole;
a plug disposed in the through hole of the dielectric film, the plug configured to seal a first end of the vertical hole proximate the first side of the horizontal circuitry layer, the plug thermally connecting the first phase change material in the vertical channel to the first side of the horizontal circuitry layer, the dielectric film being partially removed in a horizontal trench that at least partially surrounds the plug;
a first copper layer positioned on the dielectric film, the first copper layer covering the plug and covering the horizontal trench;
a horizontal channel comprising a second phase change material positioned on the first copper layer in the horizontal trench;
a cap positioned on the horizontal channel and configured to seal the second phase change material within the horizontal channel;
a second copper layer disposed on the first copper layer, the second copper layer covering the cap and thereby surrounding the horizontal channel and the cap with copper material; and
a solder mask disposed on the second copper layer, the solder mask exposing the second copper layer over the plug and over at least a portion of the cap, the exposed portion of the second copper layer defining a contact region configured to contact a heat-producing electrical component.

15. The device of claim 14, wherein the second phase change material is the same as the first phase change material.

* * * * *